United States Patent
Iida et al.

(10) Patent No.: US 7,056,035 B2
(45) Date of Patent: Jun. 6, 2006

(54) OPTICAL MODULE, OPTICAL APPARATUS INCLUDING OPTICAL MODULE, AND METHOD FOR USING OPTICAL MODULE

(75) Inventors: Kaoru Iida, Tokyo (JP); Takahiro Okada, Tokyo (JP); Takashi Koseki, Tokyo (JP); Masaru Saito, Tokyo (JP); Jun Miyokawa, Tokyo (JP); Toru Fukushima, Tokyo (JP); Takeshi Aikiyo, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 601 days.

(21) Appl. No.: 10/305,195

(22) Filed: Nov. 27, 2002

(65) Prior Publication Data

US 2003/0165306 A1  Sep. 4, 2003

(30) Foreign Application Priority Data

| Dec. 21, 2001 | (JP) | ............................. 2001-390420 |
| Dec. 21, 2001 | (JP) | ............................. 2001-390421 |
| Feb. 12, 2002 | (JP) | ............................. 2002-033751 |
| Aug. 15, 2002 | (JP) | ............................. 2002-237090 |
| Aug. 15, 2002 | (JP) | ............................. 2002-237091 |

(51) Int. Cl.
*G02B 6/36* (2006.01)

(52) U.S. Cl. ..................................................... 385/92
(58) Field of Classification Search .................. 385/92
See application file for complete search history.

(56) References Cited

U.S. PATENT DOCUMENTS

| 5,150,371 | A  | * | 9/1992  | Abramov et al. ............. 372/34 |
| 6,208,456 | B1 | * | 3/2001  | Lawrence ................... 359/333 |
| 6,215,941 | B1 | * | 4/2001  | Nagai et al. ................ 385/136 |
| 6,385,222 | B1 |   | 5/2002  | Aikiyo |
| 6,522,486 | B1 | * | 2/2003  | Furuhashi et al. .......... 359/819 |
| 6,747,820 | B1 | * | 6/2004  | Zbinden et al. ............. 359/820 |
| 2001/0055346 | A1 |  | 12/2001 | Aikiyo et al. |

* cited by examiner

*Primary Examiner*—Daniel Stcyr
(74) *Attorney, Agent, or Firm*—Oblon, Spivak, McClelland, Maier & Neustadt, P.C.

(57) ABSTRACT

An optical module includes a package; an optical device housed in the package, and having a temperature-dependent characteristic; a thermo-module connected to the optical device to control its temperature and configured to heat or cool the optical device when supplied with a first electric current in one direction or a second electric current in a direction opposite to the first electric current, respectively; and a heating element disposed close to the optical device and configured to heat the optical device when supplied with an electric current.

44 Claims, 23 Drawing Sheets

OPTICAL MODULE, OPTICAL APPARATUS INCLUDING OPTICAL MODULE, AND METHOD FOR USING OPTICAL MODULE

CROSS-REFERENCE TO RELATED APPLICATIONS

This application claims priorities from Japanese Patent Application No. 2001-390420, No. 2001-390421, No. 2002-33751, No. 2002-237090, and No. 2002-237091 which are incorporated herein by reference.

BACKGROUND OF THE INVENTION

1. Field of the Invention

The present invention relates to an optical module including an optical device, an optical apparatus including an optical module, and a method for using an optical module.

2. Description of the Related Art

Various optical apparatuses are used in optical communications systems, and some of those apparatuses comprise an optical device having a temperature-dependent characteristic. Such an apparatus has a thermo-module for adjusting the temperature of the optical device, and a control unit for controlling the thermo-module in order to keep the characteristic of the optical device constant.

This thermo-module includes two insulating plates and a plurality of peltier elements interposed therebetween. When an electric current is supplied in one direction to thermo-module, the temperature of one insulating plate rises and the temperature of the other insulating plate falls. On the contrary, when an electric current is supplied in an opposite direction, the temperature of the other insulating plate rises and the temperature of the one insulating plate falls. The optical device is fixed on the one insulating plate, for example with solder, so that it can be heated or cooled through the one insulating plate of the thermo-module.

However, sometimes it becomes impossible suddenly to obtain desired characteristics of the optical apparatus during the operation or, especially immediately after the apparatus is started up.

SUMMARY OF THE INVENTION

An optical module constructed in accordance with the principle of the invention includes a package; an optical device housed in the package and having a temperature-dependent characteristic; a thermo-module connected to the optical device to control a temperature of the optical device and configured to heat or cool the optical device when supplied with a first electric current in one direction or a second electric current in a direction opposite to the first electric current, respectively; and a heating element disposed close to the optical device and configured to heat the optical device when supplied with an electric current.

An optical apparatus constructed in accordance with the principle of the invention includes an optical module, the optical module having a package; an optical device housed in the package and having a temperature-dependent characteristic; a temperature sensor disposed in the vicinity of the optical device and configured to detect a temperature of the optical device; and a thermo-module connected to the optical device to control the temperature of the optical device and configured to heat or cool the optical device when supplied with a first electric current in one direction or a second electric current in a direction opposite to the first electric current, respectively. The optical apparatus further includes a thermo-module power supply for supplying an electric current to the thermo-module; and a control unit for controlling a polarity and an intensity of the electric current from the thermo-module power supply to the thermo-module thereby to heat or cool the optical device based on the temperature of the optical device, the control unit carrying out an overheat prevention function for preventing the optical device from being overheated due to a heating operation of the thermo-module.

A method for using an optical module according to one aspect of the invention includes: a preheating step for preliminarily heating an optical device prior to supplying one of a first electric current to a thermo-module in one direction to heat the optical device and a second electric current to the thermo-module in a direction opposite to the first electric current to cool the optical device, when starting up the optical module, wherein:

the optical module has a package; the optical device housed in the package and having a temperature-dependent characteristic; a temperature sensor disposed in the vicinity of the optical device and configured to detect a temperature of the optical device; and the thermo-module connected to the optical device to control the temperature of the optical device and configured to heat or cool the optical device when supplied with the first electric current or the second electric current, respectively.

A method for using the optical module according to another aspect of the invention includes: a temperature detection step for detecting a temperature of an optical device during the operation of the optical module; and a temperature control step for supplying a first electric current to a thermo-module in one direction to heat the optical device or a second electric current to the thermo-module in a direction opposite to the first electric current to cool the optical device based on a deviation of the temperature of the optical device from a predetermined value, thereby to maintain the temperature of the optical device at the predetermined value; wherein the optical module has a package; the optical device housed in the package and having a temperature-dependent characteristic; a temperature sensor disposed in the vicinity of the optical device and configured to detect a temperature of the optical device; the thermo-module connected to the optical device to control the temperature of the optical device and configured to heat or cool the optical device when supplied with the first electric current or the second electric current, respectively; and a heating element disposed close to the optical device and configured to heat the optical device when supplied with an electric current.

In one embodiment, the temperature control step has a process of supplying an electric current to the heating element when the first electric current is supplied to the thermo-module.

A method for using the optical module according to still another aspect of the invention includes:

an environmental temperature detection step for detecting a temperature of an environment in which the optical module is placed; and a temperature control step for supplying one of a first electric current to a thermo-module in one direction to heat an optical device and a second electric current to the thermo-module in a direction opposite to the first electric current to cool the optical device based on a deviation of the temperature of the optical device from a predetermined value, thereby to control the temperature of the optical device at the predetermined value, the temperature control step further including:

a calculation process for finding a maximum allowable first electric current to the thermo-module based on the temperature of the environment and the driving current to the optical device, the maximum allowable first electric current being an electric current with which the temperature of the optical device is kept at a predetermined maximum temperature or less even if continues to be supplied to the thermo-module; and a restriction process for restricting the first electric current to the thermo-module to the maximum allowable first electric current or less;

wherein the optical module has a package; the optical device housed in the package and having a temperature-dependent characteristic; a temperature sensor disposed in the vicinity of the optical device and configured to detect a temperature of the optical device; and the thermo-module connected to the optical device to control the temperature of the optical device and configured to heat or cool the optical device when supplied with the first electric current or the second electric current, respectively.

BRIEF DESCRIPTION OF THE DRAWINGS

The present invention will become more fully understood from the detailed description given hereinbelow and the accompanying drawings which are given by way of illustration only, and thus, are not limitative of the present invention, and wherein.

DETAILED DESCRIPTION

First Embodiment

Figure 1:
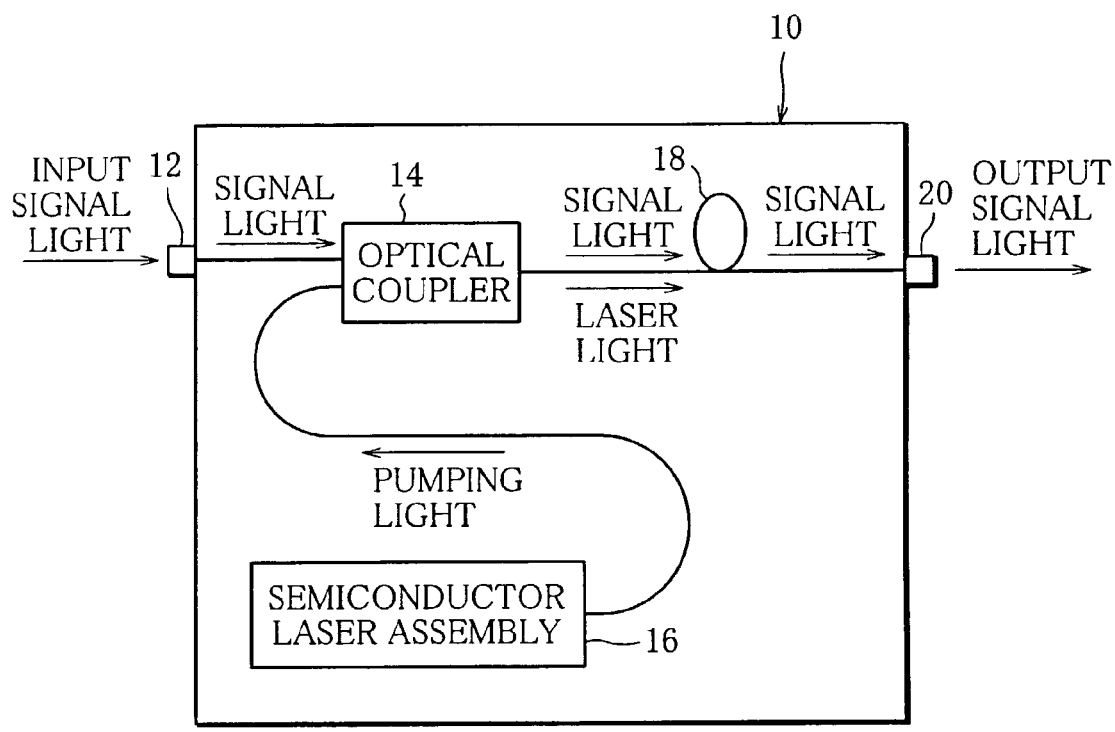
FIG. 1 is a schematic constitutional diagram of an optical fiber amplifier according to a first embodiment of the present invention.

FIG. 1 shows an optical fiber amplifier 10 (hereinafter, referred to as an OFA) according to a first embodiment of the invention. This OFA 10 is an optical apparatus that receives an input signal light and amplifies the received signal light to be emitted as an output signal light.

The OFA 10 has an input portion 12 to which the input signal light is input. One input end of a coupler 14 is connected to the input portion 12. In addition, an output of at least one semiconductor laser assembly 16 (hereinafter, referred to as an SLA) for emitting a pumping laser light is connected to another input end of the coupler 14. One end of an Er-doped fiber 18 (hereinafter, referred to as an EDF) is connected to an output end of the coupler 14, and the input signal light incident on the EDF 18 is amplified while propagating through the EDF 18. An output portion 20 is connected to another end of the EDF 18, and the signal light amplified in the EDF 18 is emitted from the output portion 20.

Figure 2:
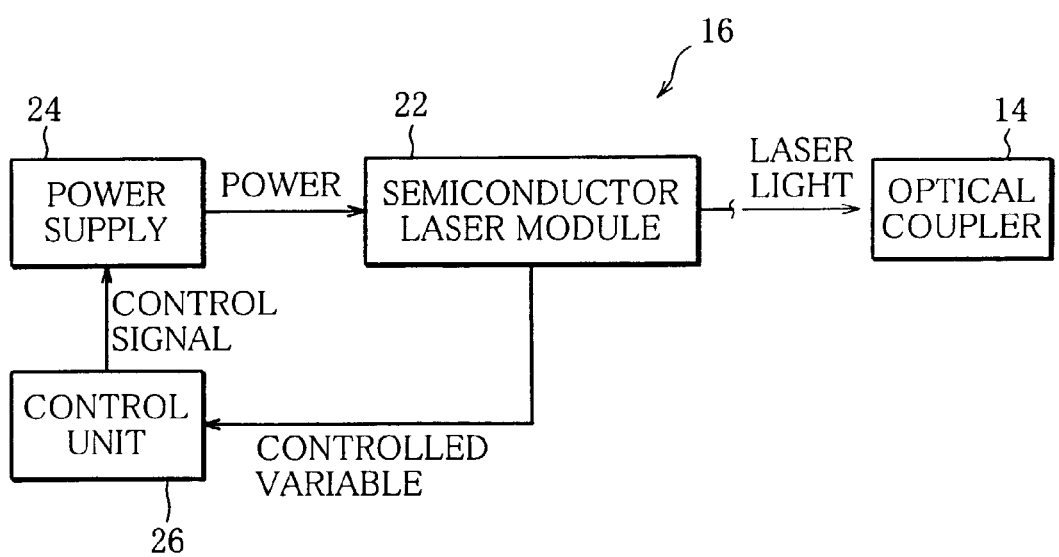
FIG. 2 is a schematic constitutional diagram of a semiconductor laser assembly as used in the amplifier of FIG. 1.

As shown in FIG. 2, the SLA 16 comprises a semiconductor laser module 22 (hereinafter, referred to as an SLM 22) which is an optical module for emitting a laser light. An electric power supply 24, which will be described later, is connected to the SLM 22, and the SLM 22 emits the laser light when supplied with electric power from the supply 24. On the other hand, a control unit 26 for monitoring and/or controlling the operation state of the SLM 22 is connected to the SLM 22, and a predetermined set of controlled variables, which will be described later, is input to the control unit 26 from the SLM 22. The control unit 26 transmits a control signal to the power supply 24 in order to adjust the amount of the electric power to the SLM 22 so that the controlled variables will approach desired values.

It should be noted that SLA 16 is not limited to an apparatus for producing a pumping light for OFA, but can generally be an apparatus for producing a laser light and can constitute a transmitter or other light sources of an optical communications system independently or accompanied with a modulator.

Figure 3:
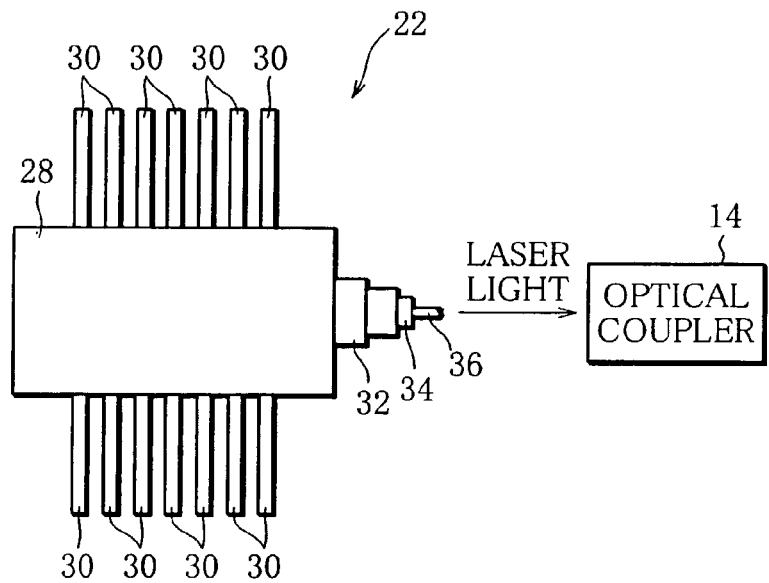
FIG. 3 is a plane view of a semiconductor laser module as used in the assembly of FIG. 2.

FIG. 3 shows an outer shape of the SLM 22. The SLM 22 is so-called of a butterfly type and comprises a rectangular package 28. The inside and outside of the package 28 can be electrically connected via lead pins 30 protruding from both side walls of the package 28.

A hollow cylindrical sleeve 32 with a ferrule 34 fixed thereinto is fitted into an opening formed on one end wall of the package 28. A proximal end portion of an optical fiber 36 is fixedly inserted into the ferrule 34. The optical fiber 36 extends to the outside of the package 28, and its distal end portion is connected to the input end of the coupler 14. Thus, the laser light propagates from the inside to the outside of the package 28 through the optical fiber 36.

Figure 4:
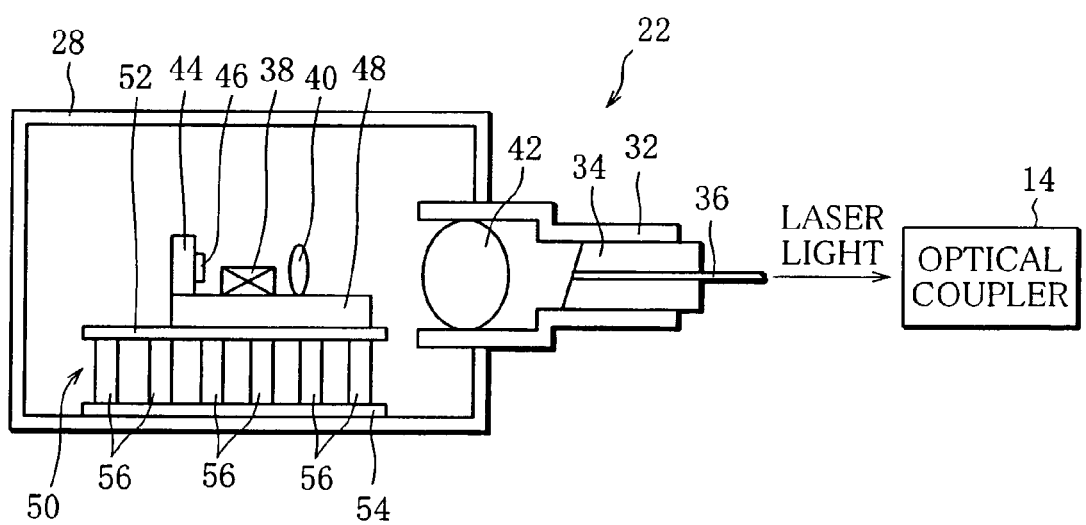
FIG. 4 is a sectional view of the semiconductor laser module of FIG. 3.

As shown in FIG. 4, the SLM 22 has a light-emitting unit 38 inside the package 28, and the light-emitting unit 38 converts the electric power supplied from the supply 24 via lead pins 30 into an optical power that is emitted as a laser light. Two lenses 40 and 42 are disposed between the light-emitting unit 38 and the optical fiber 36. The light-emitting unit 38 and the optical fiber 36 are thus optically coupled via the lenses 40 and 42, so that the laser light from the light-emitting unit 38 propagates into the optical fiber 36.

A photodiode 46 (hereinafter, referred to as a PD), which is fixed on a photodiode carrier 44 (hereinafter, referred to as a PD carrier), is disposed on an opposite side of the light-emitting unit 38 to the optical fiber 36. The PD 46 receives a monitor light emitted backward from the light-emitting unit 38, and converts the intensity of the monitor light into an electric signal, which is input to the control unit 26 via lead pins 30. The intensity of the laser light emitted forward from the light-emitting unit 38 can be indirectly monitored thereby, since the front to rear ratio of a semiconductor laser is almost constant.

The light-emitting unit 38, the lens 40 and the PD carrier 44 are disposed on a thermo-module 50 via a substrate 48. The thermo-module 50 includes two insulating plates 52 and 54 made of alumina ($Al_2O_3$) or aluminum nitride (AlN). These insulating plates 52 and 54 are parallel to each other, and a plurality of peltier elements 56 are fixedly interposed between them. The substrate 48 and the insulating plate 52 are fixed together by use of thermal fusion type connection material such as In—Pb—Ag eutectic solder having a melting point of 148 degrees. The thermo-module 50 is connected to the power supply 24 via a pair of lead pins 30, and the temperature of the substrate 48 connected to the insulating plate 52 can be raised or lowered depending on a polarity of the electric current supplied from the power supply 24. That is, the temperature of the substrate 48 rises when an electric current is supplied to the thermo-module 50 in one direction, and falls when an electric current is supplied in an opposite direction. It is therefore possible to keep the temperature of the light-emitting unit 38 constant by properly changing the direction and intensity of the electric current supplied to the thermo-module 50. Hereinafter, the direction of the electric current to the thermo-module 50 that raises the temperature of the insulating plate 52 is referred to as a heating direction, and contrarily, the direction of the electric current that lowers the temperature of the insulating plate 52 is referred to as a cooling direction.

Hereinafter, the light-emitting unit 38 will be described.

Figure 5:
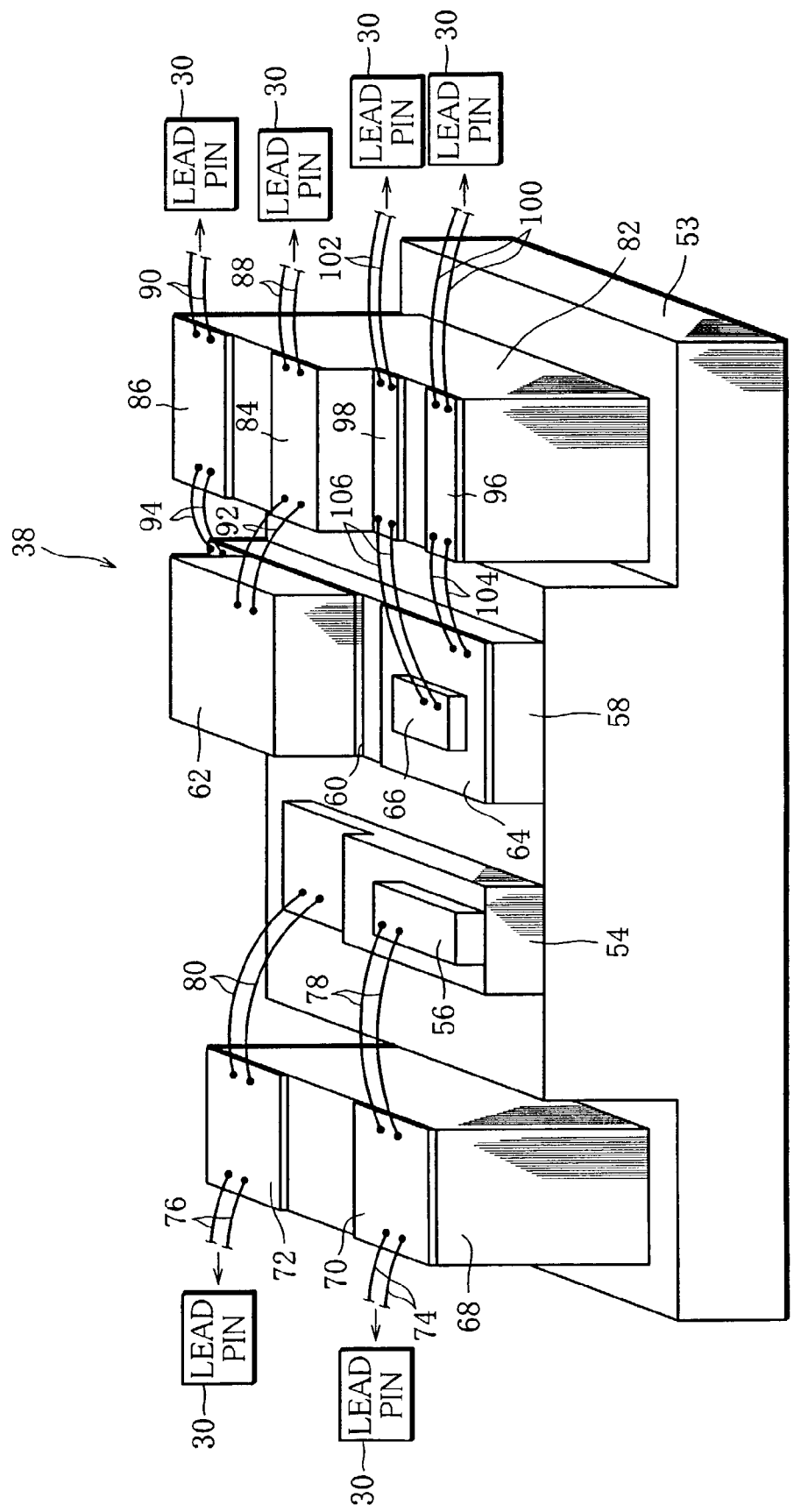
FIG. 5 is a perspective view of a light-emitting unit as used in the semiconductor laser module of FIG. 3.

As shown in FIG. 5, the light-emitting unit 38 has a semiconductor laser 56 (hereinafter, referred to as an LD) which is placed on a laser carrier 53 (hereinafter, referred to as an LD carrier) made of a Cu—W alloy via a heat sink 54 made of, for example, aluminum nitride or diamond. The LD 56 emits a laser light when an electric current is supplied to it.

Also, a sub mount 58 is disposed on the LD carrier 53 away from the heat sink 54. A thermistor 62 is disposed on one end side on the sub mount via an Au-plating layer 60. The temperature of the LD 56 (hereinafter, referred to as a Ts) disposed near the thermistor 62 can be monitored by detecting the resistivity of the thermistor 62. That is, the thermistor 62 can function as a temperature sensor.

A chip-shaped heater 66 is disposed on the other end side of the sub mount 58 via an Au-plating layer 64. In more detail, the heater 66 is fixed on the Au-plating layer 64 by using a high melting point solder such as Au—Sn, Au—Ge or Au—Si alloy. The heater 66 is made of a material such as Ni—Cr based alloy or Cu—Ni based alloy, for example, and generates heat when an electric current is supplied. It should be noted that the heater 66 can function only as a heating element, and never functions as a cooling element to cool down the surroundings unlike the thermo-module 50.

The Au-plating layer 60 and the Au-plating layer 64 are separated from each other, and thus the thermistor 62 and the heater 66 are electrically insulated.

A ceramic support 68 is disposed on the LD carrier 53, and Au-plating layers 70 and 72 are formed on an upper surface of the support 68, forming a part of an electric pathway connecting the LD 56 and corresponding lead pins 30, together with Au wires 74, 76, 78 and 80.

On a side opposite to the support 68 on the LD carrier 53 is disposed another ceramic support 82, an upper surface of which is stepped. Au-plating layers 84 and 86 are formed on an upper top surface of the stepped surfaces, and the Au-plating layers 60, 84 and 86 form a part of an electric pathway connecting the thermistor 62 and corresponding lead pins 30, together with Au wires 88, 90, 92 and 94.

On the other hand, Au-plating layers 96 and 98 are formed on a lower top surface of the stepped surfaces, and the Au-plating layers 64, 96 and 98 form a part of an electric pathway connecting the heater 66 and corresponding lead pins 30, together with Au wires 100, 102, 104 and 106.

Now, the electrical constitution of the SLA 16 will be described.

Figure 6:
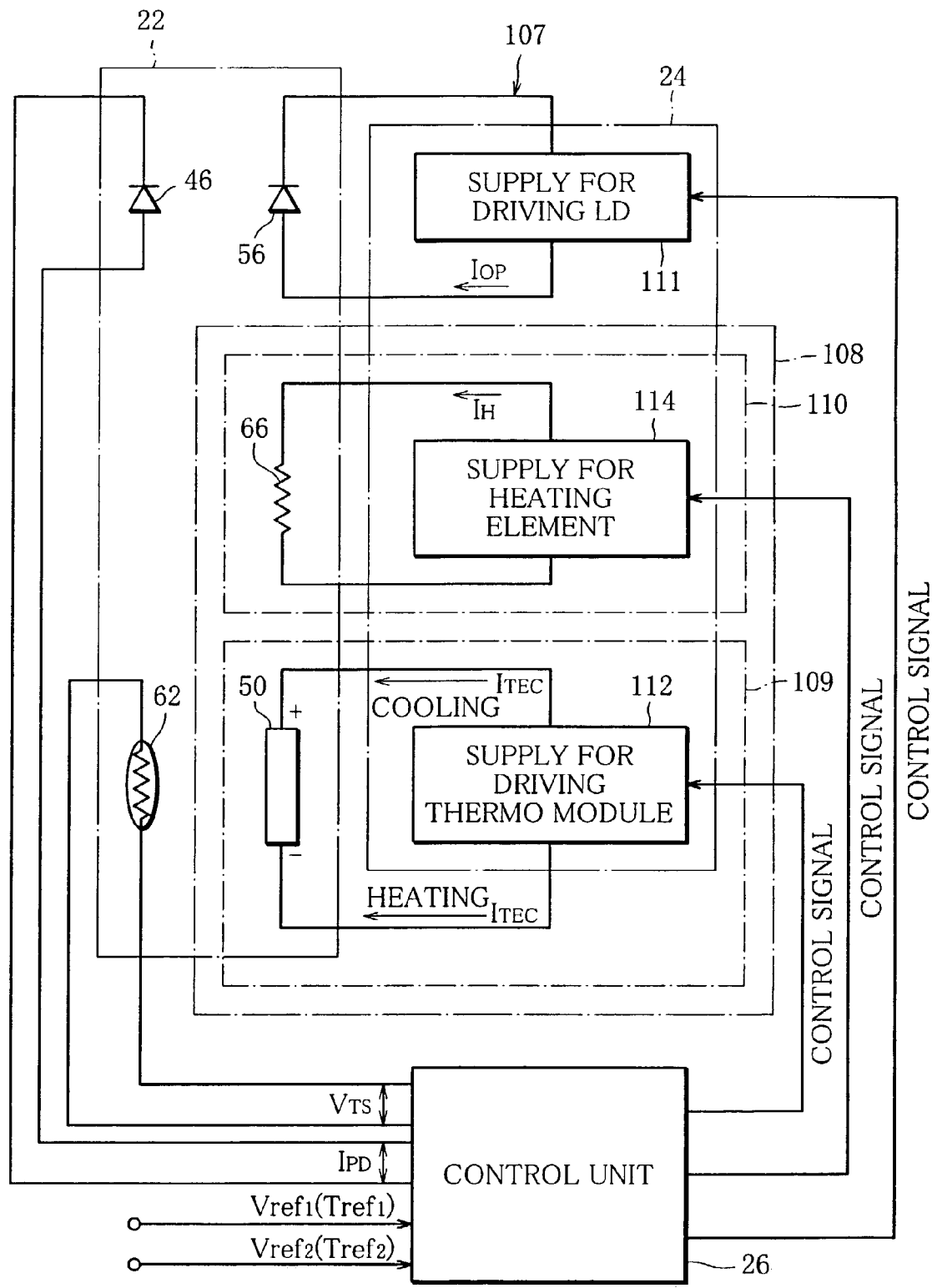
FIG. 6 is an explanatory diagram of electrical constitution of the assembly of FIG. 2.

As shown in FIG. 6, the SLA 16 includes a circuit 107 for driving LD (hereinafter, referred to as a $C_{LD}$) and a temperature controlling circuit 108 (hereinafter, referred to as a $C_{TS}$), each of which is controlled by a control unit 26. The $C_{TS}$ 108 further includes a first circuit 109 (hereinafter, referred to as a $C_{TS1}$) and a second circuit 110 (hereinafter, referred to as a $C_{TS2}$).

The $C_{LD}$ 107 includes the LD 56 and an electric power supply 111 for driving the LD 56 (hereinafter, referred to as an $S_{LD}$). The LD 56 is connected to the $S_{LD}$ 111 as a load, and the $S_{LD}$ 111 supplies an electric current to the LD 56 (hereinafter, referred to as a $I_{OP}$) for laser oscillation.

The $C_{TS1}$ 109 includes the thermo-module 50 and an electric power supply 112 for driving the thermo-module (hereinafter, referred to as an $S_{TEC}$). The thermo-module 50 is connected to the $S_{TEC}$ 112 as a load, and the $S_{TEC}$ 112 supplies an electric current to the thermo-module 50 (hereinafter, referred to as an $I_{TEC}$) SO that the temperature of the insulating plate 52 of the thermo-module 50 is raised or lowered.

The $C_{TS2}$ 110 includes the heating element(heater) 66 and an electric power supply 114 for the heating element 114 (hereinafter, referred to as an $S_H$). The heater 66 is connected to $S_H$ 114 as a load, and the $S_H$ 114 supplies an electric current to the heater 66 (hereinafter, referred to as an $I_H$) for heat generation.

Therefore, the electric power supply 24 includes the $S_{LD}$, $S_{TEC}$ and $S_H$.

As shown in FIG. 6, a control unit 26, on the other hand, receives a voltage signal from the thermistor 62 (hereinafter, referred to as a $V_{TS}$) that corresponds to the temperature of the LD 56 (hereinafter, referred to as a $T_S$), and an electric current signal from a PD 46 (hereinafter, referred to as an $I_{PD}$) that corresponds to the intensity of the laser light from the LD. Further, the control unit 26 is connected to a first reference voltage (hereinafter, referred to as a Vref1) and a second reference voltage (hereinafter, referred to as a Vref2), which are described later, and generates control signals to each of the $S_{LD}$ 111, $S_{TEC}$ 112 and $S_H$ 114 based on the received signals and the reference voltages.

The Vref1 is used when the SLA 16 is started up.

Herein, starting up the SLA 16 means starting supplying the electric current to the SLM 22 by transmitting control signals to any or all of the $S_{LD}$ 111, $S_{TEC}$ 112 and $S_H$ 114 in a state in which the supply 24 is not supplying the electric current to the SLM 22.

In addition, driving or operating the SLA 16 means continuously producing a laser light of predetermined intensity and wavelength from the SLA 16 in a state in which the LD 56 is kept at a predetermined temperature (hereinafter referred to as a driving temperature).

Now, if the control unit 26 is designed such that $S_{TEC}$ 112 begins to supply $I_{TEC1}$ to the thermo-module 50 simultaneously with or immediately after the starting up of SLA 16, and if the SLA 16 is started up under conditions in which the Ts of the LD 56 detected by the thermistor 62 is lower than a predetermined start-up temperature (hereinafter, referred to as a Tref1), an excessive $I_{TEC}$ that would extraordinarily heat the LD 56 could be instantaneously supplied from the $S_{TEC}$ 112 to the thermo-module 50.

Figure 7:
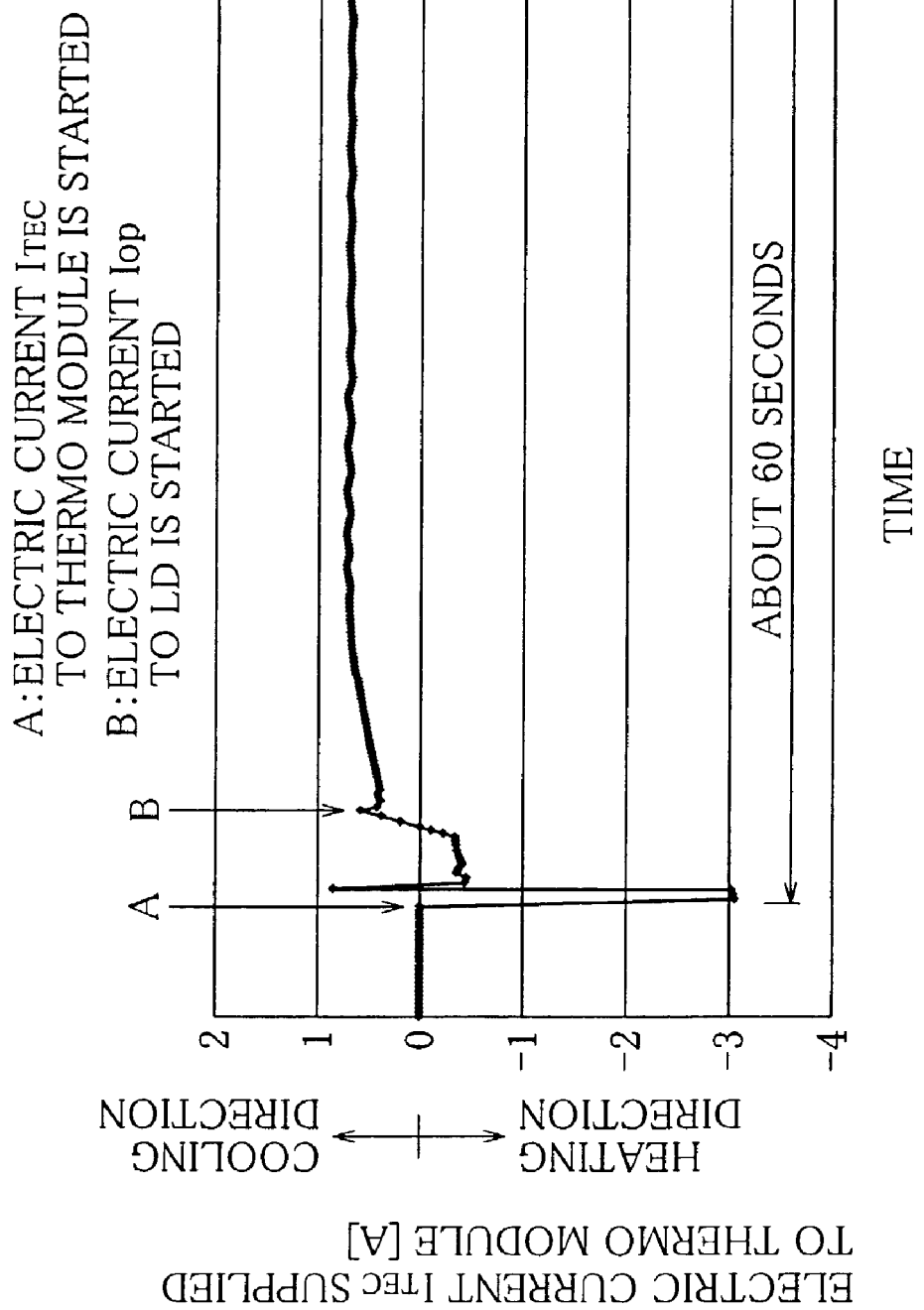
FIG. 7 is a graph showing a temporal change in an electric current $I_{TEC}$ supplied to a thermo-module when starting-up the assembly of FIG. 2, with a first supply of the electric current $I_{TEC}$ to the thermo-module, followed by a supply of an electric current $I_{OP}$ to a semiconductor laser.

More specifically, if the SLM 22 is designed to emit a laser light of predetermined intensity and wavelength at the temperature (Ts) of 25° C., and if the thermo-module 50 begins to be supplied with the $I_{TEC}$ from $S_{TEC}$ 112 simultaneously with or immediately after the starting up of the SLM 22 at an environmental temperature of 10° C., a temporal change in $I_{TEC}$ often shows an excessive amount of current in the heating direction being flown immediately after the supply of the $I_{TEC}$ is started, as shown in a graph of FIG. 7.

When the excessive $I_{TEC}$ flows in the heating direction and the thermo-module 50 is extraordinarily heated thereby, the LD 56 is extraordinarily heated, which might develop crystal defects present in the LD 56 and could significantly deteriorate its characteristics.

Further, when the thermo-module 50 is extraordinarily heated, components such as the light-emitting unit 38 and the lens 40 disposed on the thermo-module 50 via the substrate 48 are quickly heated to a high temperature. The graph of FIG. 7 shows a temporal change in $I_{TEC}$ in the case where a maximum value of the $I_{TEC}$ in the heating direction is set at −3 A (ampere). Even when the $I_{TEC}$ in the heating direction is restricted to about this maximum value, the components such as the LD 56 and the lens 40 can be heated up to the temperature of 200° C. or higher.

When they are heated to such an extraordinarily high temperature, a thermal fusion type connection material such as In—Pb—Ag eutectic solder having a melting point of 148° C. used to fix the substrate 48 on the thermo-module 50 is melted to cause the substrate 48 to be shifted from its original, properly aligned fixed position. The positional shift of the substrate 48 causes the LD 56 and the lens 40 to shift from their originally aligned positions, whereby problems occur such as optical decoupling. The misalignment causes the LD 56 and lens 40 to shift with respect to the optical fiber 36. In particular, if an angular shift of 0.2° occurs in the substrate 48 with respect to the optical fiber 36, a 95% loss in optical output may result in causing substantial lowering of the optical output intensity.

Further, the glass-made lens 40 adheres to, for example, an unillustrated metal-made holder, utilizing glass solder, which is fixed at the substrate 48 in order to fix the lens 40 to the substrate 48. In this case, when the thermo-module 50 is quickly overheated, a crack occurs at the junction point between glass and solder between the lens 40 and the metal holder by a large difference in the thermal expansion ratio between glass and metal. Problems arise, wherein, by occurrence of the crack, the lens 40 dislodges from the metal holder, and the optical coupling between the LD 56 and the optical fiber 36 may be disrupted. Consequently, it becomes impossible to obtain the favorable optical output from the SLM 22.

In addition, in the case where another SLM is used where the optical fiber with a lens formed on its tip end for directly collecting the laser light from the LD 56 is fixed onto the substrate 48 utilizing a thermal fusion type connection material such as solder in place of the lenses 40 and 42 and the optical fiber 36, when the thermo-module 50 is quickly overheated, the solder is melted to cause positional shift of the optical fiber 36 with respect to the LD 56, which leads to a disruption of the optical coupling between the LD 56 and the optical fiber 36.

Still further, since in the thermo-module 50, a plurality of Peltier elements 56 and insulating plates 52,54 are fixed together with solder, extraordinry heating causes melting of the solder, whereby, for example, the Peltier elements 56 come off, and the thermo-module 50 itself may be damaged.

The excessive $I_{TEC}$ abovementioned can be attributed to a large difference between the temperature of the LD 56 (Ts) at the time of start-up and a targeted driving temperature of the LD 56, to a high thermal impedance or low thermal conductivity between the thermo-module 50 and the thermistor 62, and to a large thermal capacity of the thermo-module 50 itself. An operational mistakes, a loose connection in the electric circuit, an open-circuit, short-circuit or other abnormalities of a temperature (Ts) detection circuits including the thermistor 62, or the occurrence of excessive voltage might also be responsible for the excessive $I_{TEC}$.

In order to avoid the occurrence of the abovementioned problems associated with the excessive $I_{TEC}$, in the SLA 16 according to the first embodiment, the control unit 26 first compares the $V_{TS}$ corresponding to the Ts with the Vref1 corresponding to the Tref1 at the time of starting up the SLA 16. If the Ts is lower than the Tref1, the control unit 26 transmits a control signal to the $S_H$ 114 such that the $S_H$ 114 starts supplying the $I_H$ to the heater 66. The LD 56 is thus heated by the heat generation of the heater 66, and the Ts of the LD 56 rises.

Herein, the LD 56 is not extraordinarily heated by the heater 66, because the heater 66 is disposed closer to the thermistor 62 than the thermo-module 50, and therefore the thermal impedance between the thermistor 62 and the heater 66 is low, so that the temperature of the heater 66 is detected by the thermistor 62 relatively correctly. In addition, since the thermal capacity of the heater 66 itself is small, the heating of the LD 56 can virtually be stopped immediately after the supply of the $I_H$ to the heater 66 is stopped.

And when the Ts becomes equal to or higher than the Tref1, or when the Ts and the target driving temperature becomes close enough, the control unit 26 transmits control signals to each of the $S_{TEC}$ 112 and the $S_{LD}$ 111 such that they start supplying $I_{TEC}$ and $I_{OP}$ to the thermo-module 50 and the LD 56 respectively, whereby the SLA 16 is started up. Since the Ts is made equal to or higher than Tref1 at the time of starting supplying $I_{TEC}$ to the thermo-module, the $I_{TEC}$ does not flow in the heating direction. After the Ts has become equal to Tref1 or higher, the control unit 26 may stop supplying $I_H$ from the $S_H$ 114, or may supply it continuously or intermittently as required.

If the Ts is equal to or higher than the Tref1 at the time of start-up, on the other hand, the control unit 26 immediately transmits control signals to the $S_{TEC}$ 112 and the $S_{LD}$ 111, thereby starting up the SLA 16. In this case also, however, the $I_H$ may be supplied from the $S_H$ 114 as required.

In this way, the SLA 16 can be started up without $I_{TEC}$ to the thermo-module 50 being excessive in the heating direction. The SLA 16 is then driven continuously using the Vref2 as follows:

While the SLA 16 is being driven, the temperature Ts of the LD 56 is controlled to be a predetermined driving temperature which corresponds to Vref2 (hereinafter, referred to as Tref2) to keep the intensity and wavelength of the laser light at a predetermined value. That is, the control unit 26 transmits control signals to either or both the $S_{TEC}$ 112 or/and the $S_H$ 114 so that the Ts corresponding to the $V_{TS}$ will approach the Tref2 corresponding to the Vref2.

For example, if the Ts of the LD 56 is higher than the Tref2, the control unit 26 outputs a control signal for lowering the Ts of the LD 56. The temperature Ts of the LD 56 can be lowered by increasing $I_{TEC}$ in the cooling direction if the current in such direction is being supplied to the thermo-module 50, or by decreasing $I_{TEC}$ in the heating direction or reversing a polarity of the current as required if the current in the heating direction is being supplied to the thermo-module 50. The Ts can be lowered also by decreasing or stopping $I_H$ if it is being supplied to the heater 66.

On the contrary, if the Ts of the LD 56 is lower than the Tref2, the control unit 26 transmits a control signal for raising the temperature of the LD 56. The temperature of the LD 56 can be raised by increasing $I_{TEC}$ in the heating direction if the current in such direction is being supplied to the thermo-module 50, or by decreasing $I_{TEC}$ in the cooling direction or reversing a polarity of the current as required if the current in the cooling direction is being supplied to the thermo-module 50. The Ts can be raised also by increasing $I_H$ if it is not being supplied enough to the heater 66.

Thus, when the Ts is higher or lower than the Tref2, either or both the $I_{TEC}$ supplied to the thermo-module 50 or/and $I_H$ supplied to the heater 66 is/are properly controlled so that the Ts will be substantially equal to the Tref2. The temperature Ts of the LD 56 is stabilized in this way, enabling the LD 56 to emit a laser light of stabilized intensity and wavelength.

Preferably, the Tref2 is preset at a value lower than the Tref1. Since this setting ensures that the $I_{TEC}$ supplied to the thermo-module 50 is not in the heating direction but in the cooling direction at the very moment of starting-up, the excessive $I_{TEC}$ in the heating direction to the thermo-module 50 is prevented.

During the operation of the SLA 16, the LD 56 may be heated by both the thermo-module 50 and the heater 66.

That is, when the Ts is lower than the Tref2, heating the LD 56 only with the thermo-module 50 could cause the $I_{TEC}$ in the heating direction to be so excessive that the solder fixing together the substrate 48 and the thermo-module 50 is extraordinarily heated and is melted, disrupting the optical coupling between the LD 56 and the optical fiber 36 and substantially lowering an optical output from the SLA 16. Heating the LD 56 primarily by the heater 66 with auxiliary or no use of the thermo-module 50 in raising the temperature can ensure that $I_{TEC}$ is not excessive in the heating direction.

The heater 66 is disposed in a part on the sub mount 58 for the thermistor 62, and does not occupy a substantial space in the package 28. Therefore, there is no need to enlarge the SLM 22 in size to accommodate the heater 66.

Figure 8:
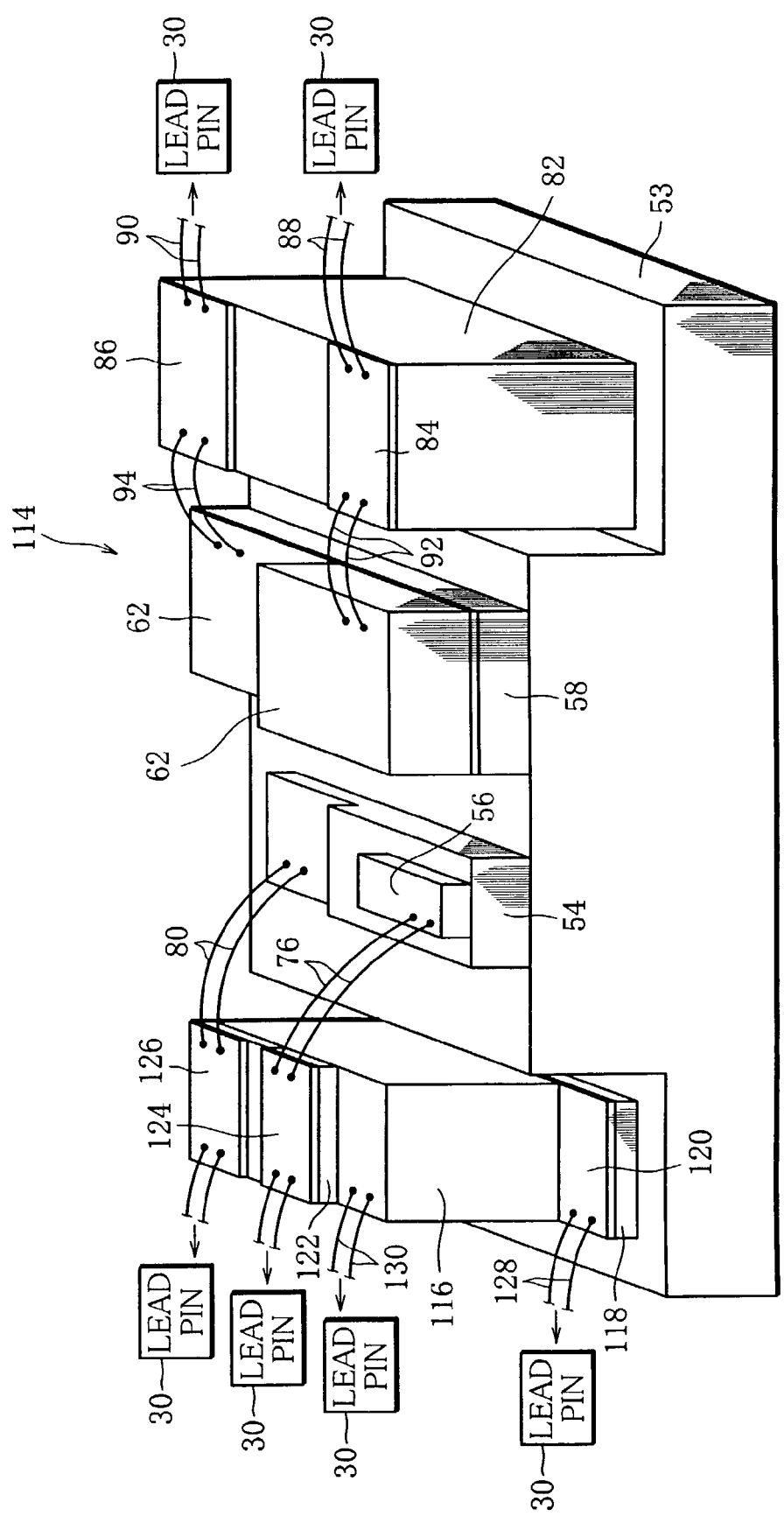
FIG. 8 is a perspective view of a modification of the light-emitting unit of FIG. 5.

The aforementioned embodiment can be variously modified, and for example, the light-emitting unit 38 may be replaced with a light-emitting unit 114 shown in FIG. 8. This light-emitting unit 114 comprises a heater 116 as a heating element in place of the heater 66.

That is, a ceramic support 118 is disposed on the LD carrier 53, and an Au-plating layer 120 is formed on an upper surface of the support 118. The heater 116 is fixed to a part on the Au-plating layer 120 by using a high melting point solder such as Au—Sn, Au—Ge or Au—Si alloy. The heater 116 is made of the same material as the heater 66.

A ceramic support 122 is disposed in a part of an upper surface of the heater 116, and Au-plating layers 124 and 126, which are separated from each other, are formed on an upper surface of the support 122. That is, the resistive heater 116 is put between the supports 122 and 118, and the Au-plating layers 124 and 126 form the electric pathway between the LD 56 and corresponding lead pins 30.

Upper surfaces of the Au-plating layer 120 and the heater 116 are electrically connected to corresponding lead pins 30 by Au wires 128 and 130.

Figure 9:
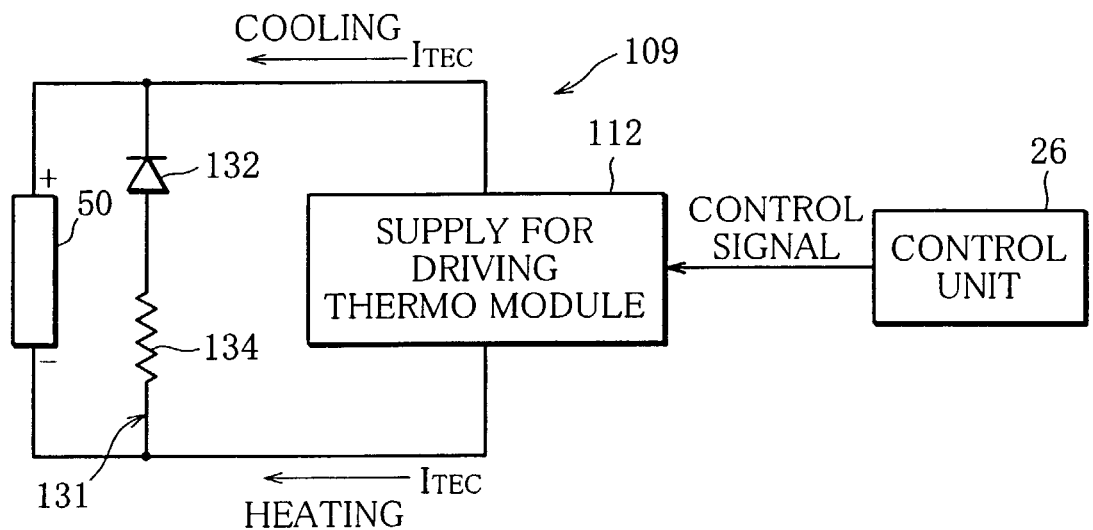
FIG. 9 is an explanatory diagram of a modification of a first temperature control circuit as used in the electrical constitution of FIG. 6.

In the abovementioned embodiment, an example is illustrated of a first circuit $C_{TS1}$ 109 in which only the thermo-module 50 is connected to the $S_{TEC}$ 112 as a load and in which the temperature Ts of the LD 56 is raised by supplying an electric current to the heater 66. However, the $C_{TS1}$ 109 preferably has a bypass circuit 131 provided in parallel to the thermo-module 50 as shown in FIG. 9, and the thermo-module 50 may be used to heat up the LD 56 with an electric current flowing therethrough in the heating direction being limited.

The bypass circuit 131 includes a diode 132 and a resistor 134 that are connected in series, and the diode 132 is oriented such that a reverse bias is applied thereto when the $I_{TEC}$ in the cooling direction is supplied to the thermo-module 50. Accordingly, when the $I_{TEC}$ in the heating direction is supplied toward the thermo-module 50, the diode 132 is turned on and a portion of the $I_{TEC}$ is shunted into the bypass circuit 131 with the remaining portion of the $I_{TEC}$ flowing into the thermo-module 50. On the contrary, when the $I_{TEC}$ in the cooling direction is supplied toward the thermo-module 50, the diode 132 is turned off and all the $I_{TEC}$ flow into the thermo-module 50. Since a part of the $I_{TEC}$ in the heating direction is shunted to the bypass circuit 131 in this way, it is possible to prevent the $I_{TEC}$ from being excessive in the heating direction.

However, in the case where the $C_{TS1}$ 109 has such a bypass circuit 131, the $I_{TEC}$ in the heating direction supplied to the thermo-module 50 is restricted, whereby the heat-up rate, ultimate temperature Ts of the LD 56 reached by the thermo-module 50 are restricted. Under such restrictions, the second circuit $C_{TS2}$ 110 can preferably be used to assist the thermo-module 50 in heating up the LD 56 to a desired driving temperature. That is, the LD 56 can be heated by increasing the $I_H$ supplied to the heater 66, which prevents the $I_{TEC}$ from being excessively supplied to the thermo-module 50 in the heating direction.

In addition, in the abovementioned embodiment, an example is illustrated of SLA 16, in which the Vref1 and the Vref2, which correspond to the start-up temperature Tref1 and the driving temperature Tref2 respectively, are set different from each other and input to the control unit 26 as shown in FIG. 6. However, the start-up temperature Tref1 and the driving temperature Tref2 may be equal to each other. In that case, one reference voltage Vref is input to the control unit 26, and used in place of the Vref1 and the Vref2 at the time of starting up of and during continuous operation of the SLA 16.

Second Embodiment

Next, an OFA 200 according to a second embodiment of the invention will be described.

Figure 10:
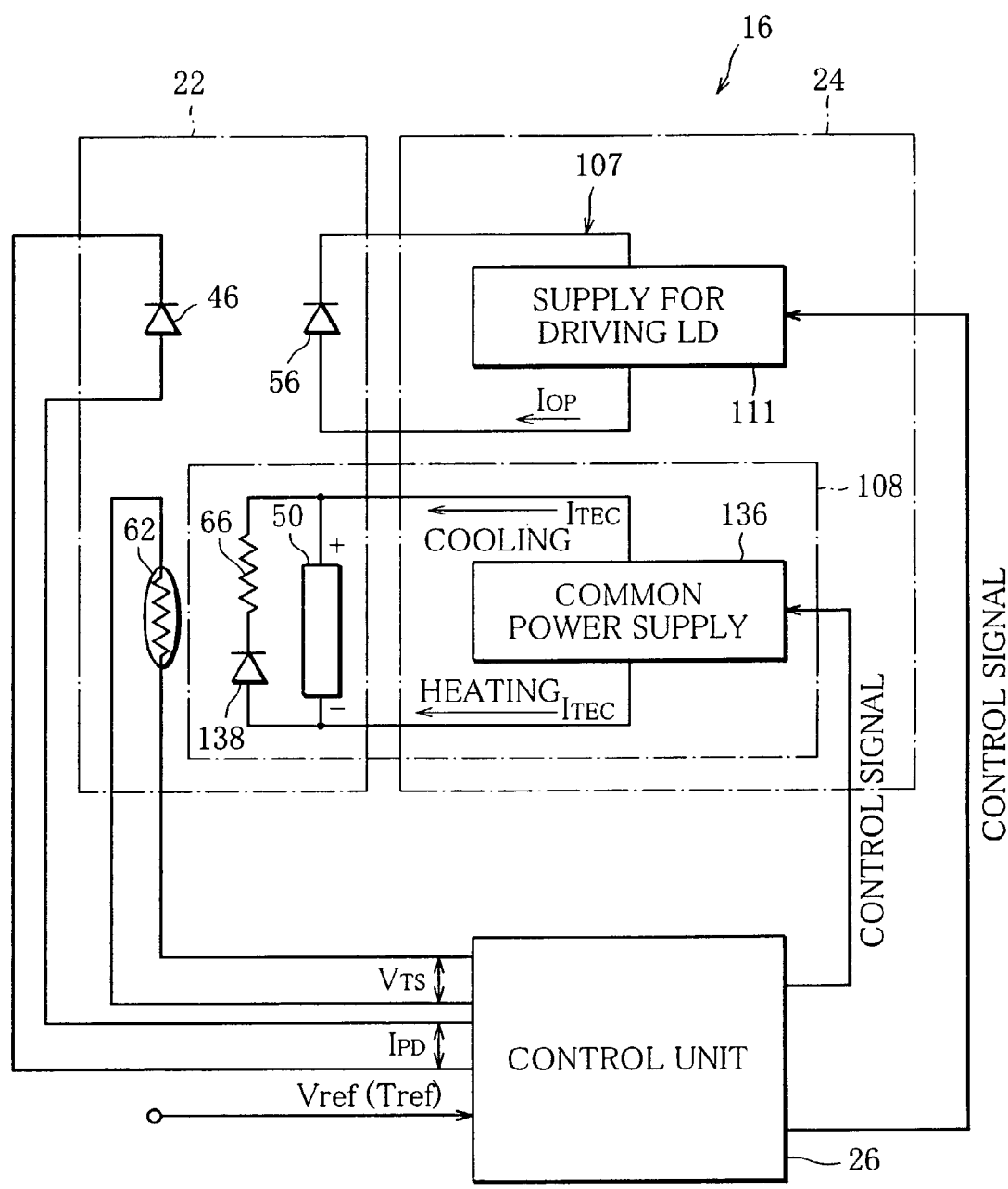
FIG. 10 is an explanatory diagram of an electrical constitution of the semiconductor laser assembly as used in the optical fiber amplifier according to a second embodiment of the present invention.

The OFA 200 is different from the OFA 10 in the constitution of the control unit 26 and the temperature controlling circuit $C_{TS}$ 108, as shown in FIG. 10.

That is, the temperature controlling circuit 108 for controlling a temperature of LD 56 of the OFA 200 includes, in place of the $S_{TEC}$ 112 and the $S_H$ 114 of FIG. 6, a single common power supply 136 (hereinafter, referred to as an $S_{COM}$) which is connected in common to the thermo-module 50 and heater 66 which are electrically parallel to each other, the heater 66 being disposed in the vicinity of the LD 56. A diode 138 is serially disposed to the heater 66. In more detail, the diode 138 is oriented so that the reverse bias is applied thereto when the $I_{TEC}$ is supplied to the thermo-module 50 in the cooling direction from the $S_{COM}$ 136, thereby preventing a portion of the $I_{TEC}$ supplied in the cooling direction from flowing through the heater 66 and ensuring the entire current in the cooling direction being supplied to the thermo-module 50. Such a function of the circuit $C_{TS}$ 108 can be realized by properly wiring between components inside the SLM 22, including the diode 138.

In the meantime, the control unit 26 of the OFA 200 of the embodiment receives only one reference voltage Vref, which corresponds to Tref and is used both to start up and to continuously drive the SLA 16.

In the OFA 200, the common power supply $S_{COM}$ 136 supplies the $I_{TEC}$ either in the heating direction or in the cooling direction to the load including the thermo-module 50 based on the result of comparing the Ts with the Tref of the control unit 26 both at the time of starting up of and during a continuous operation of the SLA 16.

For example, when the $I_{TEC}$ in the cooling direction is supplied to the load, the diode 138 turns off and prevents a part of the $I_{TEC}$ from being supplied to the heater 66. When the $I_{TEC}$ in the heating direction is supplied to the load, on the other hand, the diode 138 turns on and allows the $I_{TEC}$ to be directed both to the heater 66 and to the thermo-module 50 in proportion to the ratio of the resistance value of the heater 66 to that of the thermo-module 50.

In this way, when the $I_{TEC}$ in the heating direction is supplied to the thermo-module 50, the $I_{TEC}$ is always distributed. Therefore, the excessive $I_{TEC}$ in the heating direction is partially relieved. Accordingly, the LD 56 is prevented from being heated to a high temperature and the growth of defects in crystal of the LD 56 due to the high temperature heating can be prevented, whereby it is possible to prevent the characteristics of the LD 56 from deteriorating due to those defects.

In addition, the solder fixing between the substrate 48 and the thermo-module 50 is prevented from being melted as a result of high temperature heating of the thermo-module 50; as such, it is possible to prevent the substrate from shifting in position. Therefore, since the positional shift of the LD 56 with respect to an optical fiber 36 can be evaded, an optical decoupling (misalignment) between the optical fiber 36 and the LD 56 is avoided, thereby preventing a lowering of optical output. Thus the SLA 16 is prevented from breaking and the laser light output from the SLA 16 is prevented from decreasing.

The power supply 24 can be made small by using the common power supply $S_{COM}$ 136, thereby enabling the SLA 16 to be reduced in size.

The second embodiment described above can also be variously modified. For example, in the abovementioned second embodiment, the LD 56 is preferably heated exclusively by the heater 66, similarly to the case in the first embodiment. For that purpose, a diode 140 may be provided serially to the thermo-module 50 (see FIG. 11). In more detail, this diode 140 is oriented so that the reverse bias is applied thereto when the $I_{TEC}$ is supplied in the heating direction of the thermo-module 50.

Figure 11:
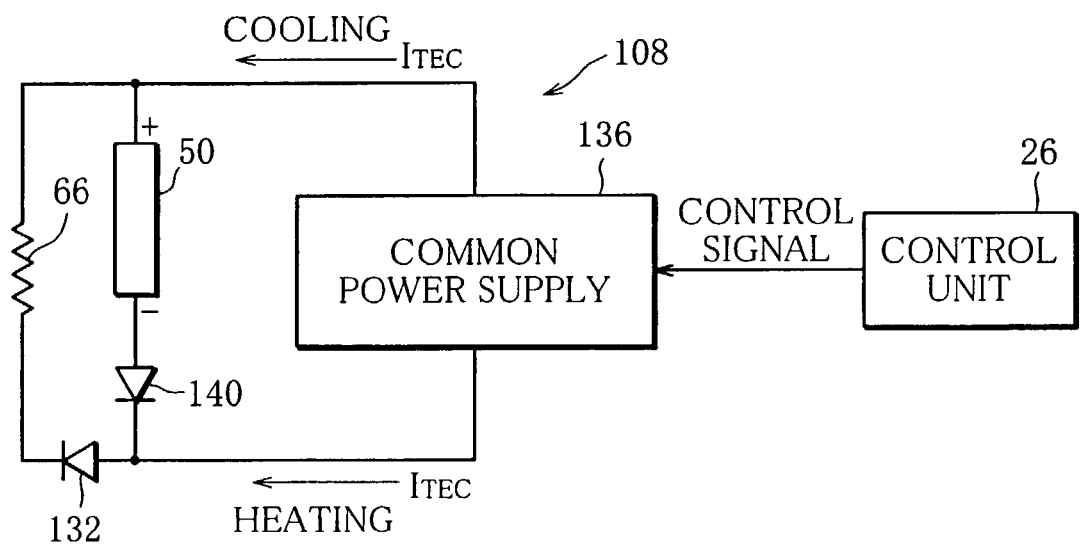
FIGS. 11 to 19 are explanatory diagrams of modifications of the temperature control circuit as used in the electrical constitution of FIG. 10.
Figure 12:
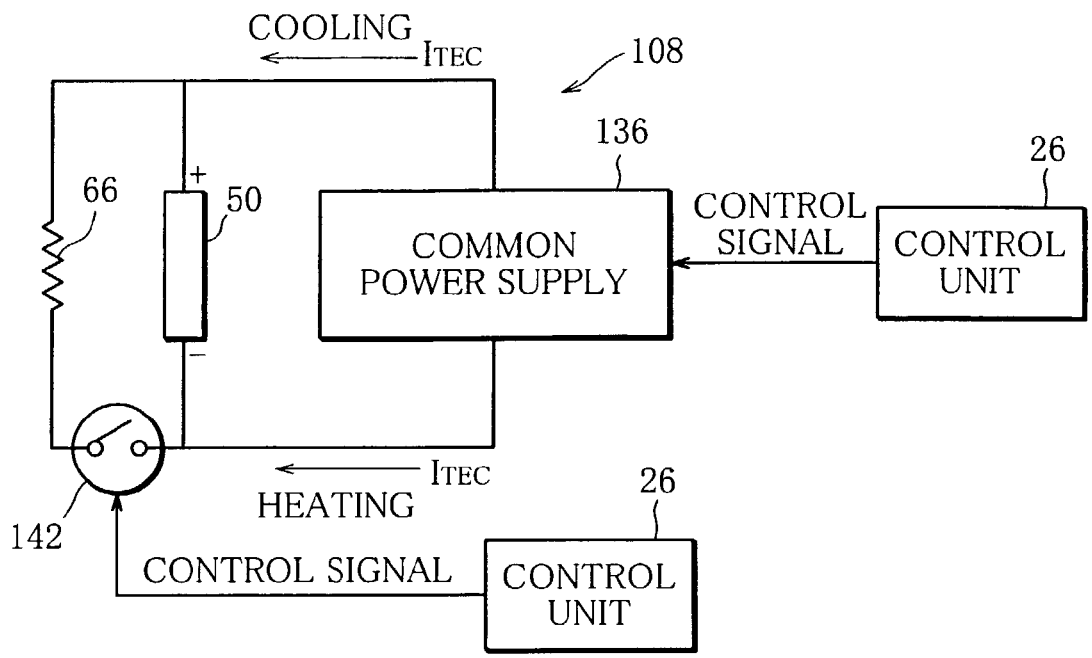
Figure 13:
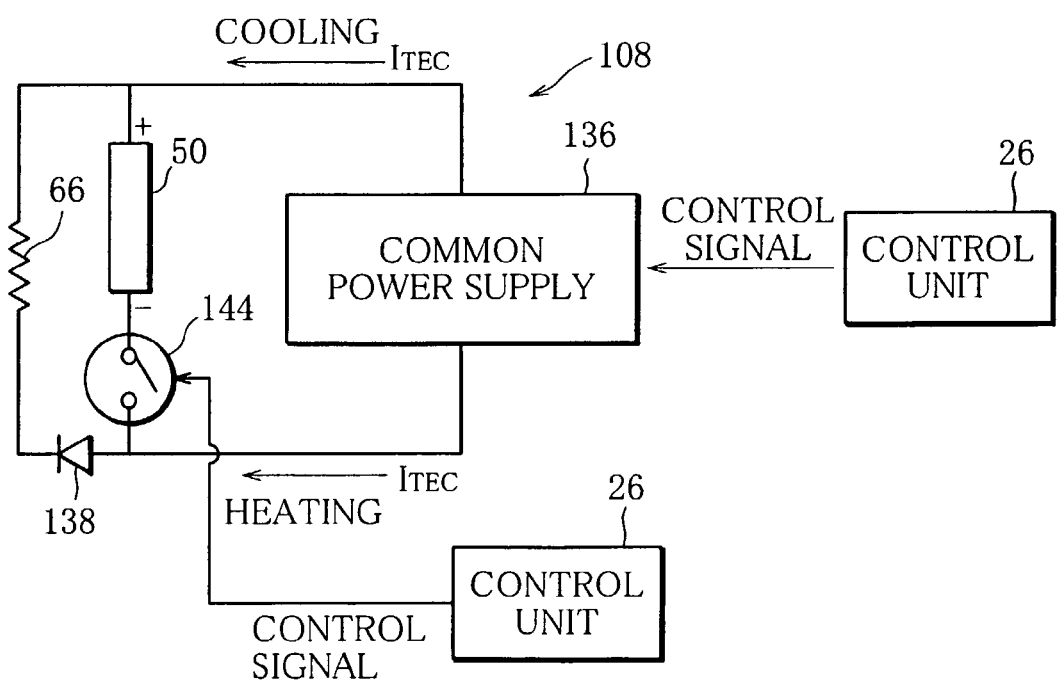
Figure 14:
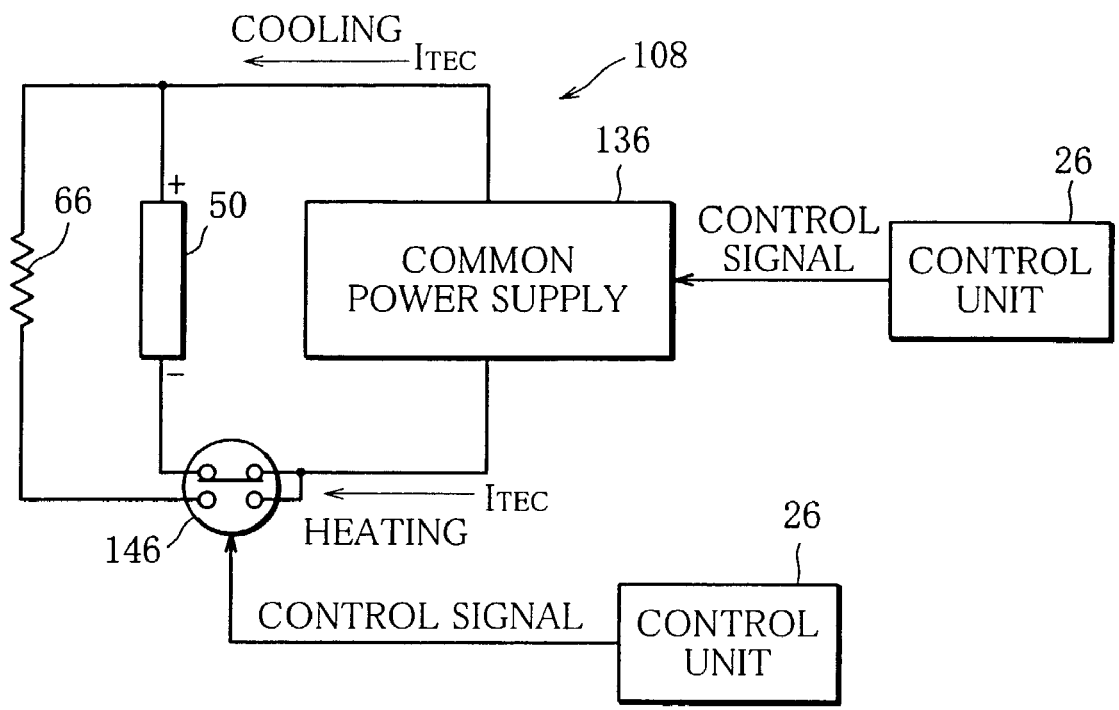

In addition, the diodes 132 and 140 in FIG. 11 may be replaced with switches 142, 144 and 146 that can be opened or closed in response to the control signal from the control unit 26, as shown in FIGS. 12 to 14.

In more detail, in the case of the temperature controlling circuit $C_{TS}$ 108 shown in FIG. 12, while the $I_{TEC}$ is being supplied in the cooling direction, the switch 142 is opened such that the $I_{TEC}$ in the cooling direction is prevented from flowing in the heater 66 and that all the $I_{TEC}$ is supplied to the thermo-module 50. While the $I_{TEC}$ is being supplied in the heating direction, the switch 142 is closed such that the $I_{TEC}$ in the heating direction is distributed to the heater 66 and the thermo-module 50 in proportion to the ratio of the resistance value of the heater 66 to that of the thermo-module 50.

In the case of the temperature controlling circuit CTS 108 shown in FIG. 13, while the $I_{TEC}$ is being supplied in the heating direction, the switch 144 is opened such that the LD 56 can be heated only by the heater 66.

In the case of the temperature controlling circuit $C_{TS}$ 108 shown in FIG. 14, the switch 146 operates in response to the control signal from the control unit 26 so that the $I_{TEC}$ in the heating or cooling direction is directed to the heater 66 or to the thermo-module 50, respectively. Namely, the switch 146 alternatively selects either the heater 66 or the thermo-module 50 in accordance with the direction of the electric current.

Figure 15:
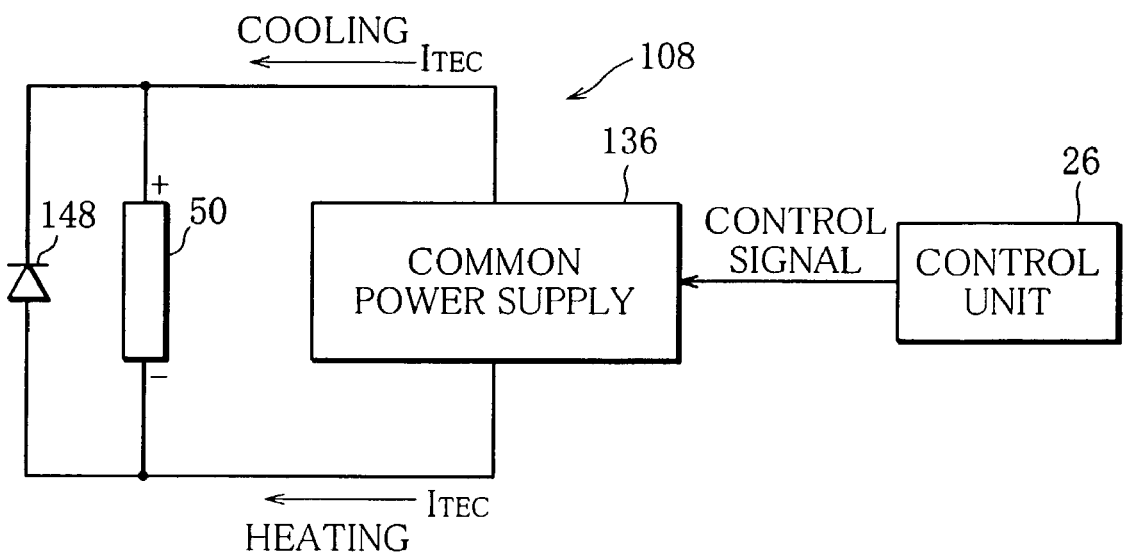
Figure 16:
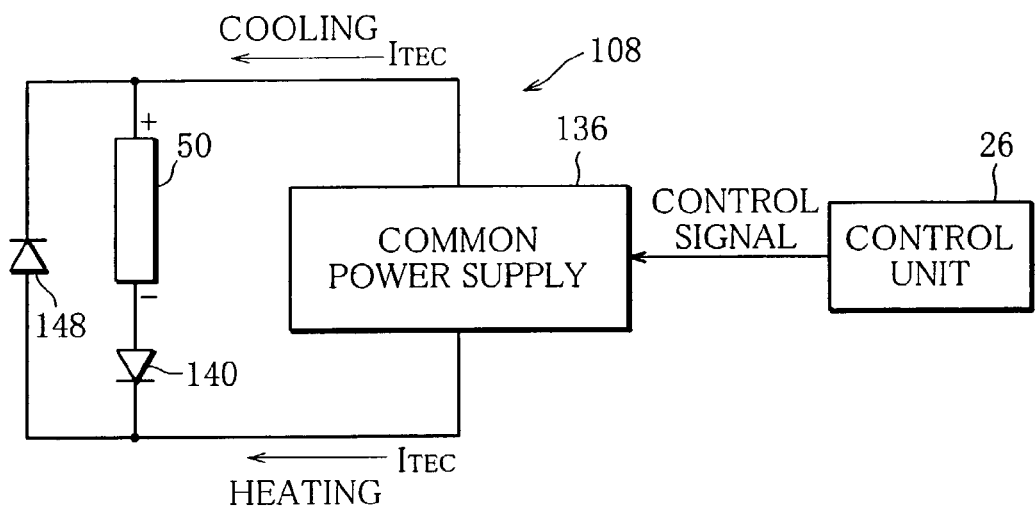

Further, a heater 66 may be replaced with a heating diode 148 which is disposed in the vicinity of the LD 56 and which generates heat when the $I_{TEC}$ is supplied in the heating direction (see FIGS. 15 and 16). The heating diode 148 is provided in electrically parallel to the thermo-module 50 and is oriented such that it is reversely biased when the $I_{TEC}$ is supplied in the cooling direction. The use of the heating diode 148 can render the diode 138, which is provided apart from the heater 66, unnecessary.

Figure 17:
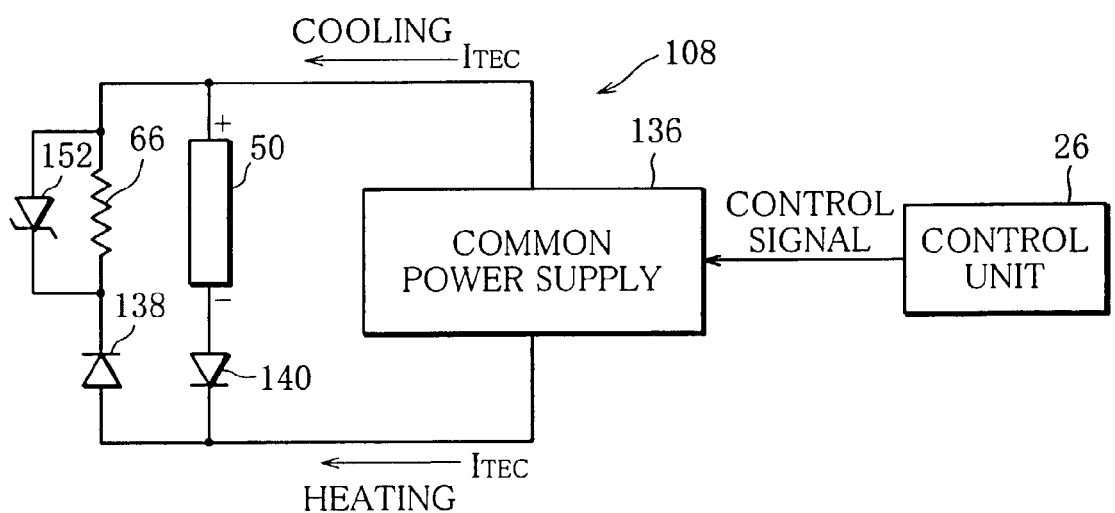
Figure 18:
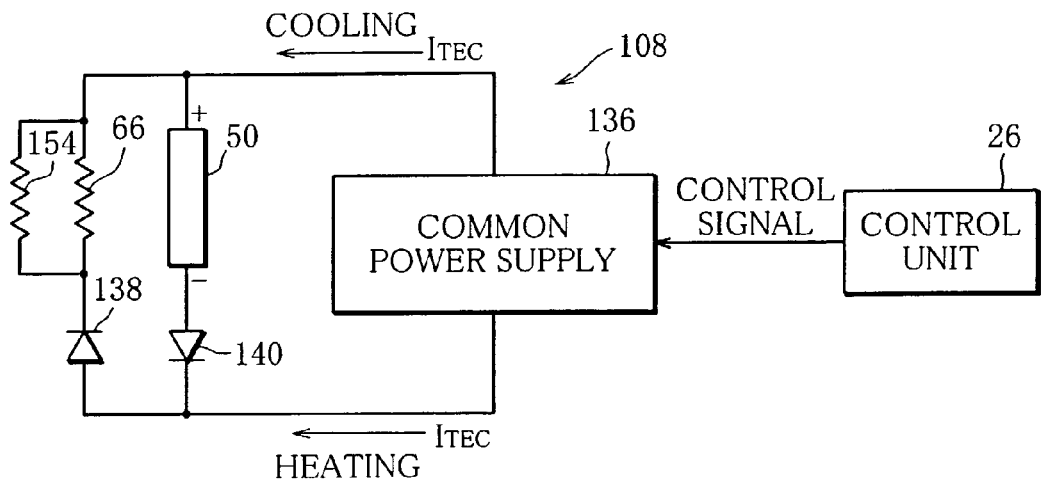

Further, in the second embodiment described above, a zener diode 152 or a resistor 154 may be provided in parallel to the heating element, such as the heater 66 or the heating diode 148, so that the current flowing through the heating element might not be excessive (see FIGS. 17 and 18). Thus, the SLM 22 can be protected not only from the extraordinary heating of the thermo-module 50 but also from the overheating of the heating element.

Namely, the zener diode 152, since it is oriented to be reversely biased to the $I_{TEC}$ supplied in the heating direction, as shown on FIG. 17, breaks down when the voltage across the heating element (the heater 66 or the heating diode 148) reaches to a break-down voltage of the zener diode, rendering the voltage across and the amount of current flowing through the heating element almost constant despite further increases in the $I_{TEC}$ in the heating direction. The resistor 154 as shown in FIG. 18 shunts a part of the current supplied to the heater 66 in proportion to the ratio of the resistivity thereof to that of the heater 66.

Figure 19:
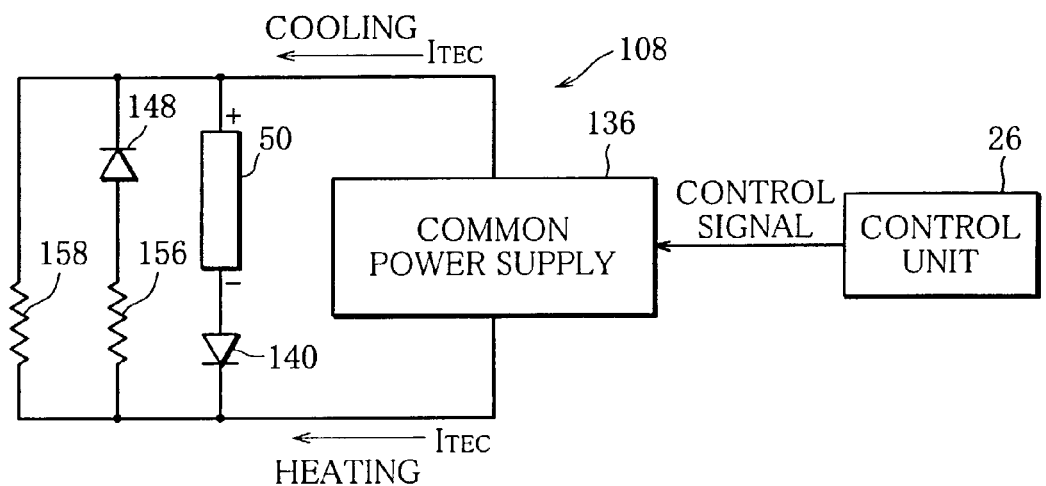

Similarly, resistors 156 and 158 may be provided as shown in FIG. 19 such that the $I_{TEC}$ will be distributed in proportion to their ratio and the current will not be supplied excessively to the heating element such as the heater 66 or the heating diode 148.

The aforementioned resistors 134, 154, 156, and 158, diodes 132 and 138, zener diode 152 and switches 142, 144 and 146 may be disposed either inside or outside of the package 28 of the SLM 22. When these components are disposed outside the package 28, they are preferably prepared as a peripheral circuit assembly that are annexed to the SLM 22. In this way, a constitution of the SLA 16 can be simplified.

Third Embodiment

Figure 20:
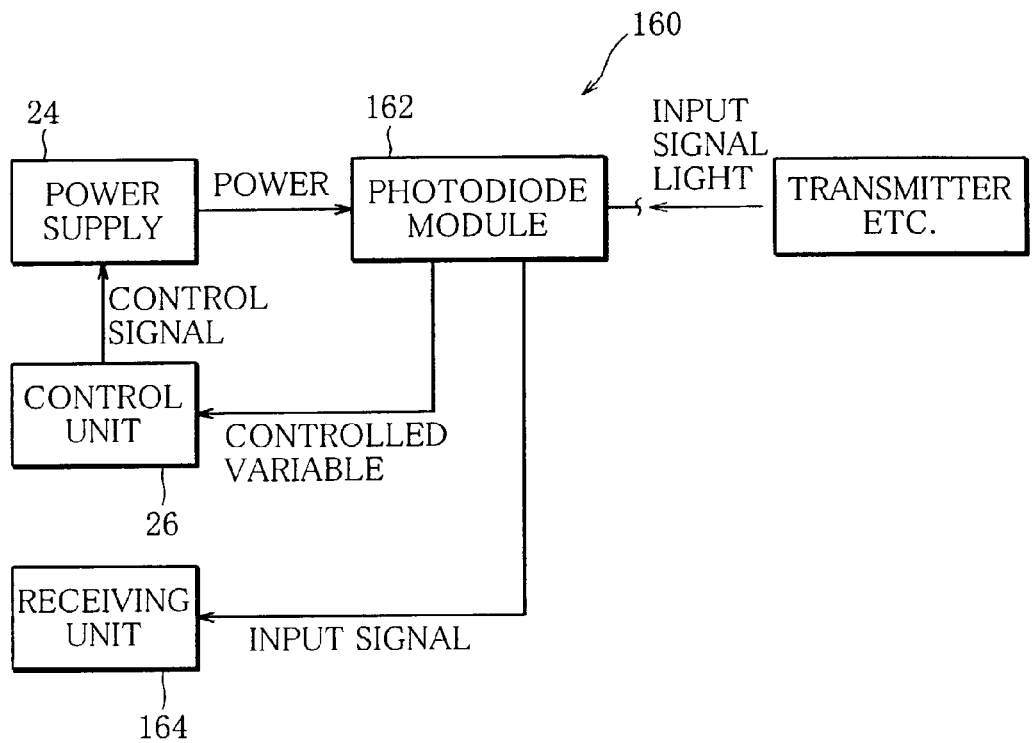
FIG. 20 is a schematic constitutional diagram of a receiver according to a third embodiment of the present invention.

FIG. 20 shows a schematic constitution of a photodiode assembly 160 (hereinafter, referred to as a PDA) according to a third embodiment of the invention.

This PDA 160 is used, for example, as a receiver in an optical communications system, or an optical apparatus disposed at the end of an optical pathway for receiving a signal light from a transmitter. In more detail, as shown in FIG. 20, the PDA 160 has a photodiode module 162 (hereinafter, referred to as a PDM), and a receiving unit 164 connected to the PDM 162. The signal light received and subjected to photoelectric conversion at the PDM 162 is input to the receiving unit 164 as an electric signal.

Figure 21:
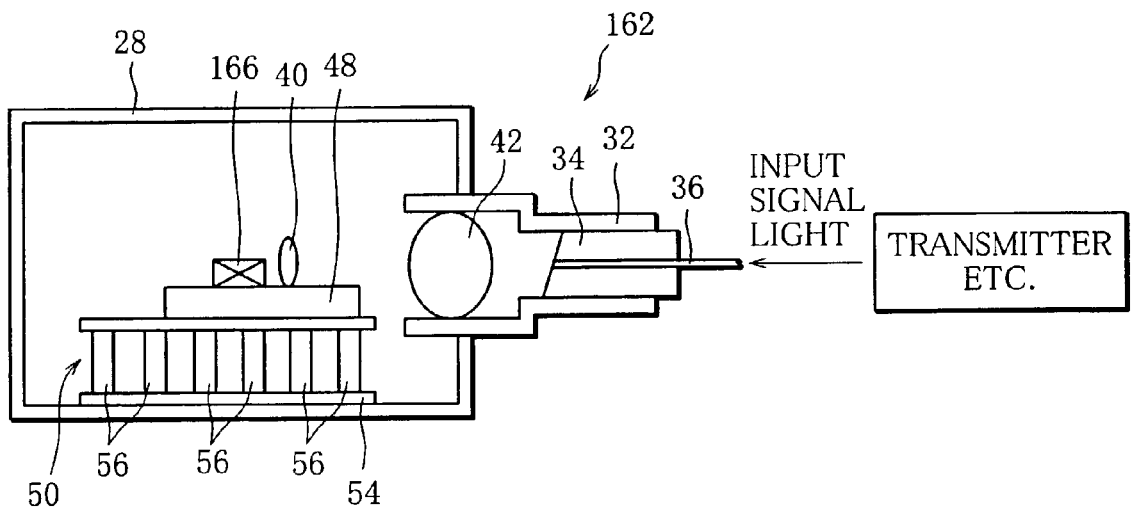
FIG. 21 is a sectional view of a photodiode module as used in the receiver of FIG. 21.
Figure 22:
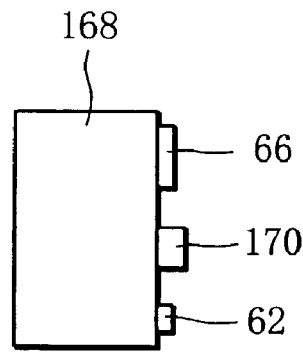
FIG. 22 is a plane view of a light-receiving unit as used in the photodiode module of FIG. 21.

As shown in FIG. 21, the PDM 162 is different from the SLM 22 in that it has a light-receiving unit 166 in place of the light-emitting unit 38, the PD 46 and the PD carrier 44 of the SLM 22. As shown in FIG. 22, the light-receiving unit 166 has a photodiode carrier 168 (hereinafter, referred to as a PD carrier) made of $Al_2O_3$ or AlN for example, and the PD carrier 168 is fixed onto the substrate 48 with thermal fusion type connection material such as In—Pb—Ag eutectic solder having a melting point of 148° C.

A photodiode 170 (hereinafter, referred to as a PD) is fixed onto a side surface of the PD carrier 168, facing an optical fiber 36. The photodiode 170 is optically coupled to the optical fiber 36, and converts the laser light incident thereon from the optical fiber 36 into an electric signal, and the performance of the light-to-electric conversion may be temperature-dependent. The thermistor 62 is disposed adjacent the PD 170 on the same side surface of the PD carrier 168, for detecting its temperature. Further, on the same side surface, the heater 66 is disposed on the opposite side of the PD 170 to the thermistor 62.

The position of the thermistor 62 is not limited to the place shown in the figure, and the thermistor 62 may be placed anywhere as long as it can properly detect the temperature of the PD 170. On the other hand, the heater 66 is preferably placed where the thermal impedance between the PD 170 and the heater 66 is lower than that between the PD 170 and the thermo-module 50, besides being able to heat the PD 170.

Figure 23:
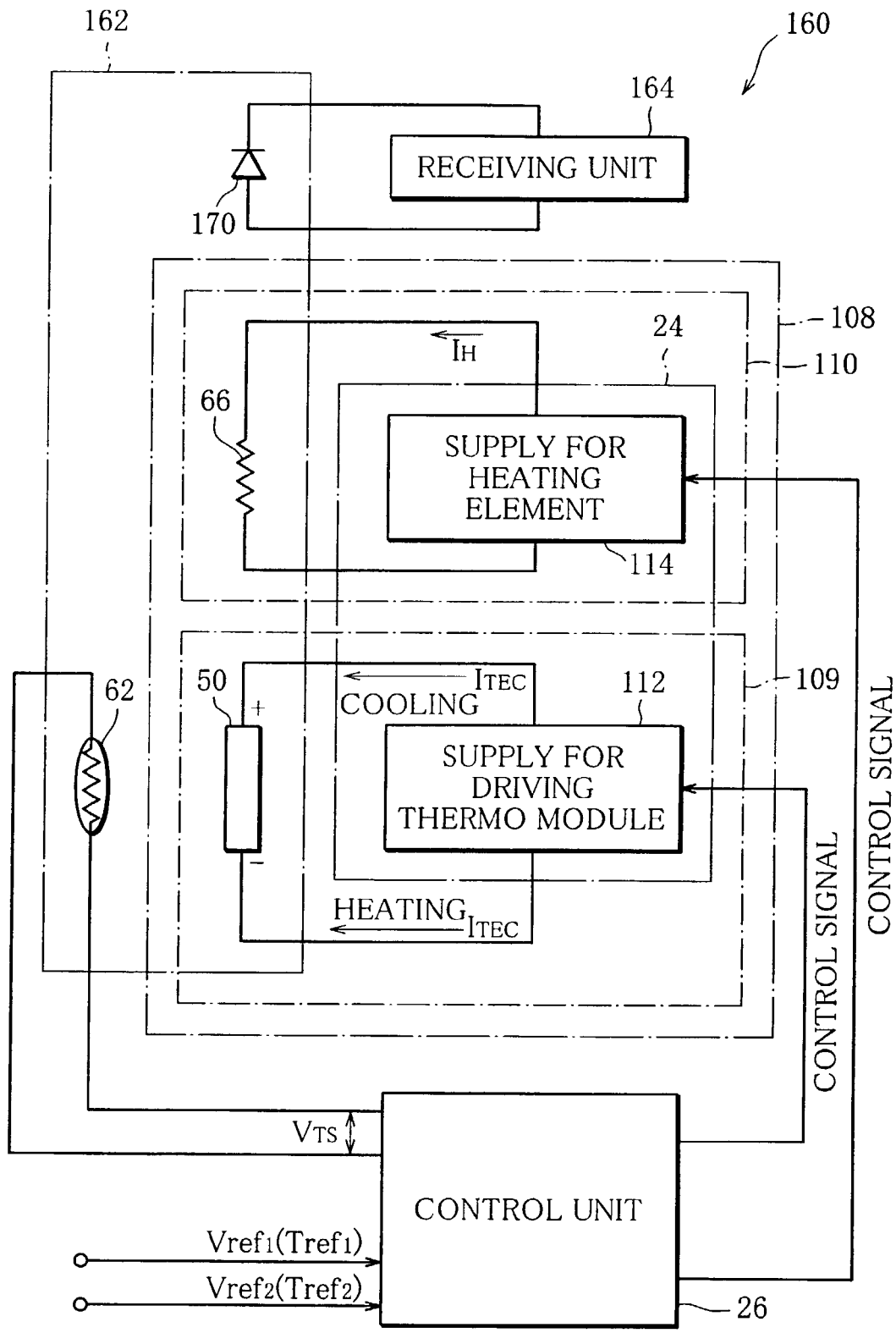
FIG. 23 is an explanatory diagram of electrical constitution of the receiver of FIG. 20.

The electrical constitution of the abovementioned PDA 160 is shown in FIG. 23.

According to the PDA 160, similarly to the case of heating the LD 56 in the first embodiment and the second embodiment, the PD 170 is heated mainly by the $C_{TS2}$ 110, or by the $C_{TS1}$ 109 and $C_{TS2}$ 110 in collaboration. It is therefore possible to keep the PD 170 at a predetermined temperature, while preventing the $I_{TEC}$ flowing through the thermo-module 50 from being excessive in the heating direction. Thus, a degradation in characteristic or a destruction of the PDA 160, such as a lowering of optical coupling efficiency between the PD 170 and the optical fiber 36 that arises from the excessive $I_{TEC}$, are prevented.

Fourth Embodiment

Figure 24:
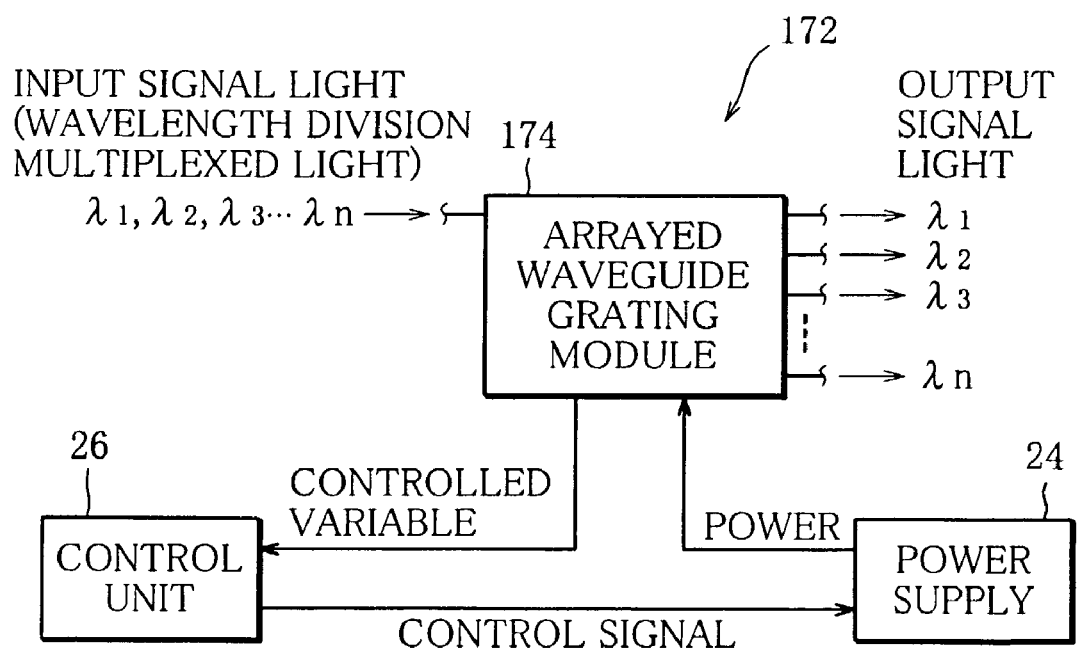
FIG. 24 is a schematic constitutional diagram of a demultiplexer in accordance with a fourth embodiment of the present invention.

FIG. 24 shows a schematic constitution of an arrayed waveguide grating assembly 172 (hereinafter, referred to as an AWGA) according to a fourth embodiment of the invention.

This AWGA 172 is disposed on an end side of the optical pathway and is used, for example, as a demultiplexer in a wavelength division multiplexing communications system. In more detail, as shown in FIG. 24, the AWGA 172 has an arrayed waveguide grating module 174 (hereinafter, referred to as an AWGM) which demultiplexes a wavelength division multiplexed light (hereinafter, referred to as a WDM light) including a plurality of lights $\lambda_1, \lambda_2, \lambda_3, \ldots \lambda_n$ by their wavelengths, and emits the respective lights of different wavelengths $\lambda_1, \lambda_2, \lambda_3, \ldots \lambda_n$ as output signal lights.

Figure 25:
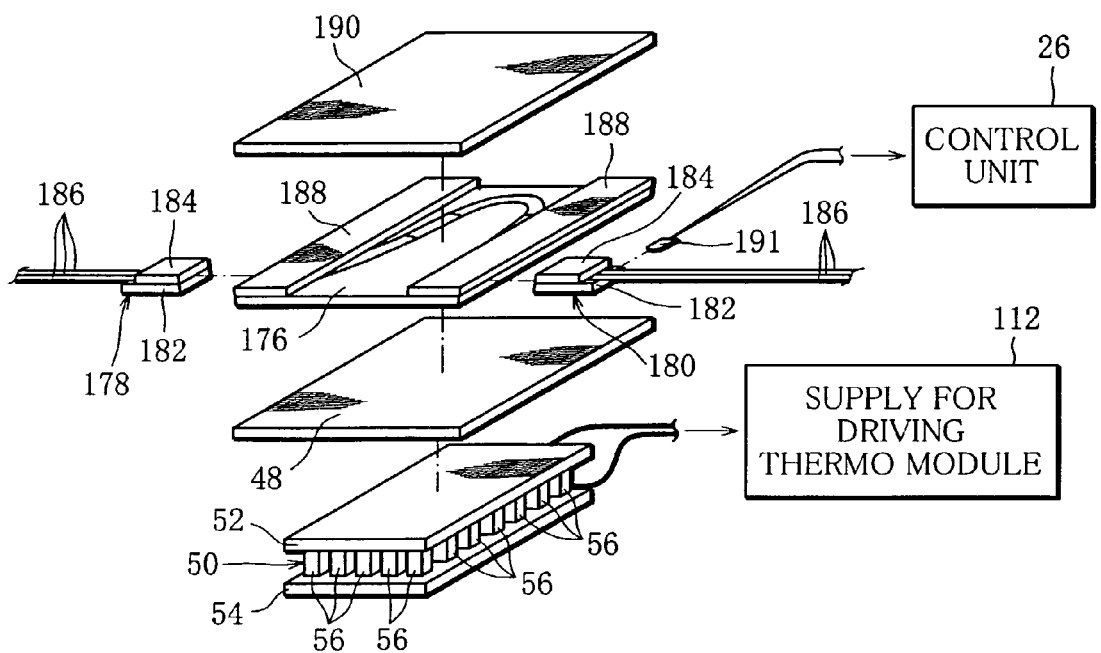
FIG. 25 is a partially exploded perspective view of the demultiplexer of FIG. 24.

As shown in the partially exploded perspective view of FIG. 25, the AWGM 174 has a thermo-module 50 and a substrate 48 in an unillustrated package in a way similar to the SLM 16. In addition, the AWGM 174 includes a heater 190. An arrayed waveguide grating device 176 (hereinafter, referred to as an AWGD) is disposed on the thermo-module 50 via the substrate 48. The AWGD 176 is fixed on the thermo-module 50 with thermal fusion type connection material. Here, especially in the AWGM 174, since the AWGD 176 is large, the substrate 48 serves to ensure in-plane uniformity of the temperature of the AWGD 176.

An optical fiber array 178 for inputting the signal light to the AWGD 176 is positioned with high accuracy on an input side of the AWGD 176, and an optical fiber array 180 for outputting the signal light from the AWGD 176 is positioned with high accuracy on an output side of the AWGD 176. Each of the optical fiber arrays 178 and 180 has a V-groove substrate 182, a cover 184, and a plurality of optical fibers 186 whose end portions are arranged in parallel with each other between the V-groove substrate 182 and the cover 184.

The heater plate 190 is disposed on an opposite side of the AWGD 176 to the substrate 48 partially via spacers 188.

A temperature sensor 191 for detecting the temperature of the AWGD 176 is disposed on a side surface of the outputting optical fiber array 180.

The position of the temperature sensor 191 is not limited to the place shown in the figure, and the temperature sensor 191 may be placed anywhere as long as it can properly detect the temperature of the AWGD 176.

Figure 26:
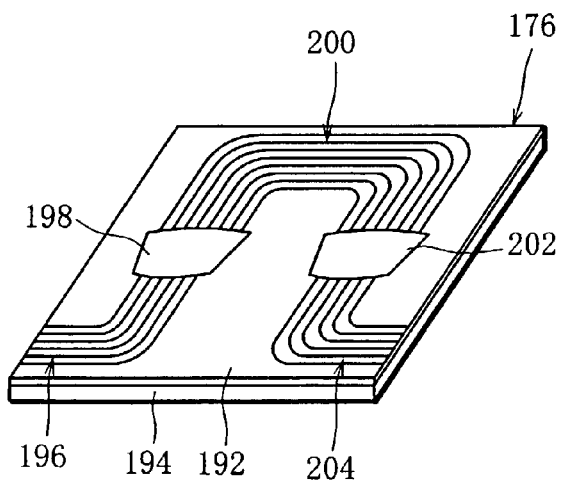
FIG. 26 is a perspective view of an arrayed waveguide grating device as used in the demultiplexer of FIG. 25.

As shown in FIG. 26, the AWGD 176 comprises a substrate 194 having a deposit film 192 on a surface thereof. An optical circuit for multiplexing or demultiplexing an incident light is formed in the deposit film 192.

Specifically, one or more input waveguides 196 are formed in the deposit film 192, with one end of each being exposed on an edge surface of the deposit film 192. WDM lights are input to the ends from the optical fiber array 178 and propagate through the input waveguides 196. An input slab waveguide 198 is formed in the deposit film 192 and connected to the other ends of the input waveguides 196, where the WDM lights from the input waveguides 196 are diffracted. An arrayed waveguide grating 200, consisting of a plurality of waveguides, is connected to the output end of the input slab waveguide 198. The WDM lights diffracted at the input slab waveguide 198 propagate through each of the waveguides of the arrayed waveguide grating 200. Since differences in optical length between the adjacent waveguides of the arrayed waveguide grating 200 are fixed, the phases of lights propagated through the different waveguides differ by an amount corresponding to the difference in the optical lengths at an output end of the arrayed waveguide grating 200.

An output slab waveguide 202 is formed in the deposit film 192 and connected to the output end of the arrayed waveguide grating 200, and a plurality of output waveguides 204 are connected to an output end of the output slab waveguide 202. The ends of the plurality of output waveguides 204 opposite to the output slab waveguide 202 are exposed on the edge surface of the deposit film 192 such that the plurality of output waveguides 204 and the optical fiber array 180 can be optically connected.

The WDM lights that have propagated through each of the waveguides of the arrayed waveguide grating 200 are diffracted in the output slab waveguide 202. Since the WDM lights are given a fixed phase difference during the propagation through the arrayed waveguide grating 200, the diffracted WDM lights interfere with each other at the output end of the output slab waveguide 202, thereby being separated spatially by the wavelength and received by each of the plurality of output waveguides 204. The demultiplexed lights are then coupled to and propagated through the optical fiber array 180 as output signal lights.

In the abovementioned AWGD 176, the temperature of the AWGD 176 needs to be controlled with very high accuracy to stabilize its demultiplexing characteristic, since the optical length of each waveguide of the arrayed waveguide grating 200 are easily affected by the temperature of the environment in which the AWGD 176 is placed. Therefore, the AWGM 174 has a constitution which can control the temperature of AWGD 176 through the thermo-module 50 and the temperature sensor 191.

Figure 27:
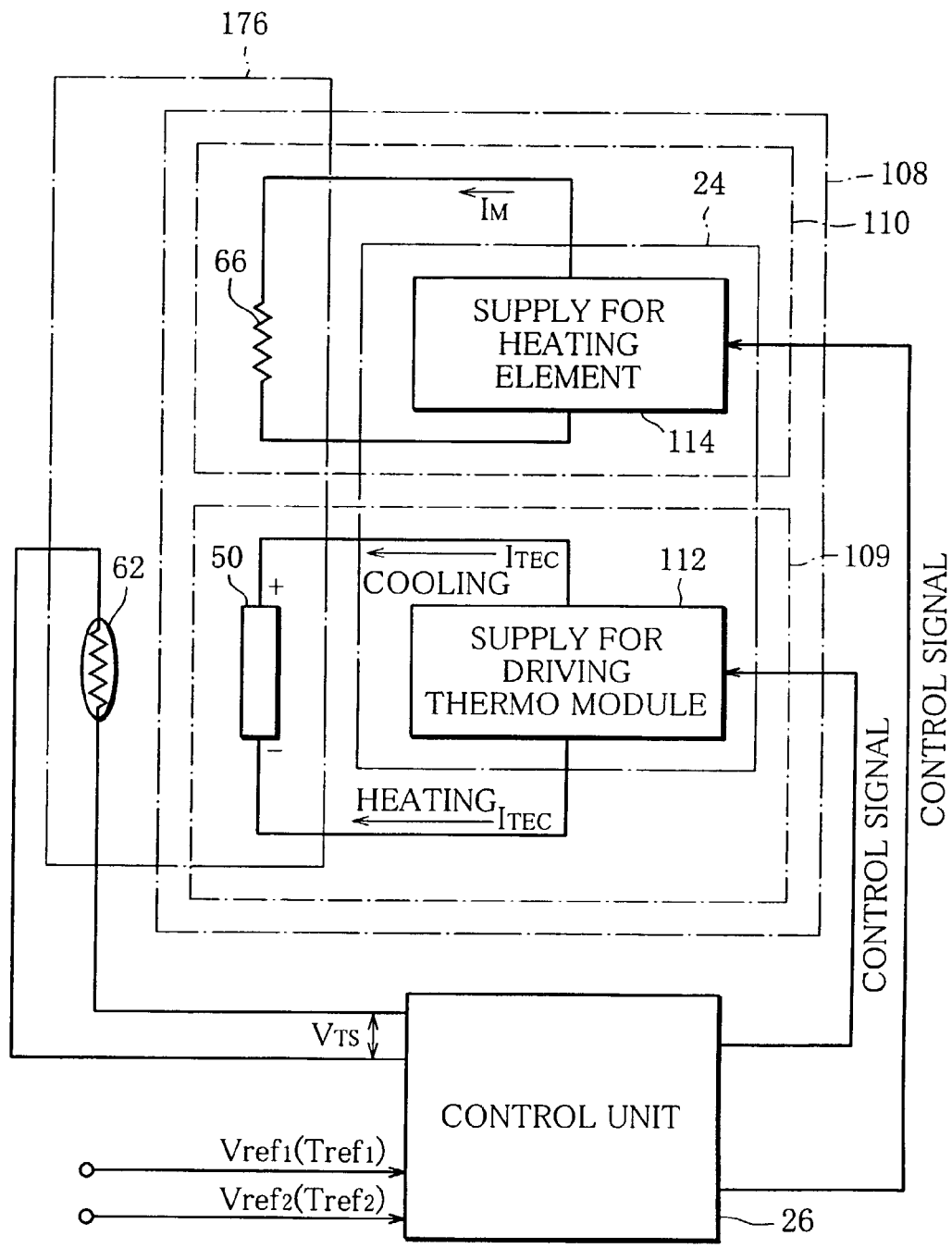
FIG. 27 is an explanatory diagram of electrical constitution of the demultiplexer of FIG. 24.

The electrical constitution of the abovementioned AWGA 172 is shown in FIG. 27.

According to this AWGA 172, similarly to the case of heating the LD 56 in the first embodiment and the second embodiment described previously, the AWGD 176 is heated mainly by the $C_{TS2}$ 110, or by the $C_{TS1}$ 109 and $C_{TS2}$ 110 in collaboration. It is therefore possible to keep the AWGD 176 at a predetermined temperature, while preventing the $I_{TEC}$ flowing through the thermo-module 50 from being excessive in the heating direction. Therefore, a degradation in characteristic or a destruction of the AWGA 172 are prevented.

In the abovementioned first to fourth embodiments, the OFA, the receiver and the demultiplexer are described. However, the present invention can be applied to other optical apparatuses as long as they comprise an optical device with a temperature-dependent characteristic and a thermo-module for controlling the temperature of the optical device.

Fifth Embodiment

In a fifth embodiment below, methods of starting up a semiconductor laser assembly including a semiconductor laser module will be described.

Figure 28:
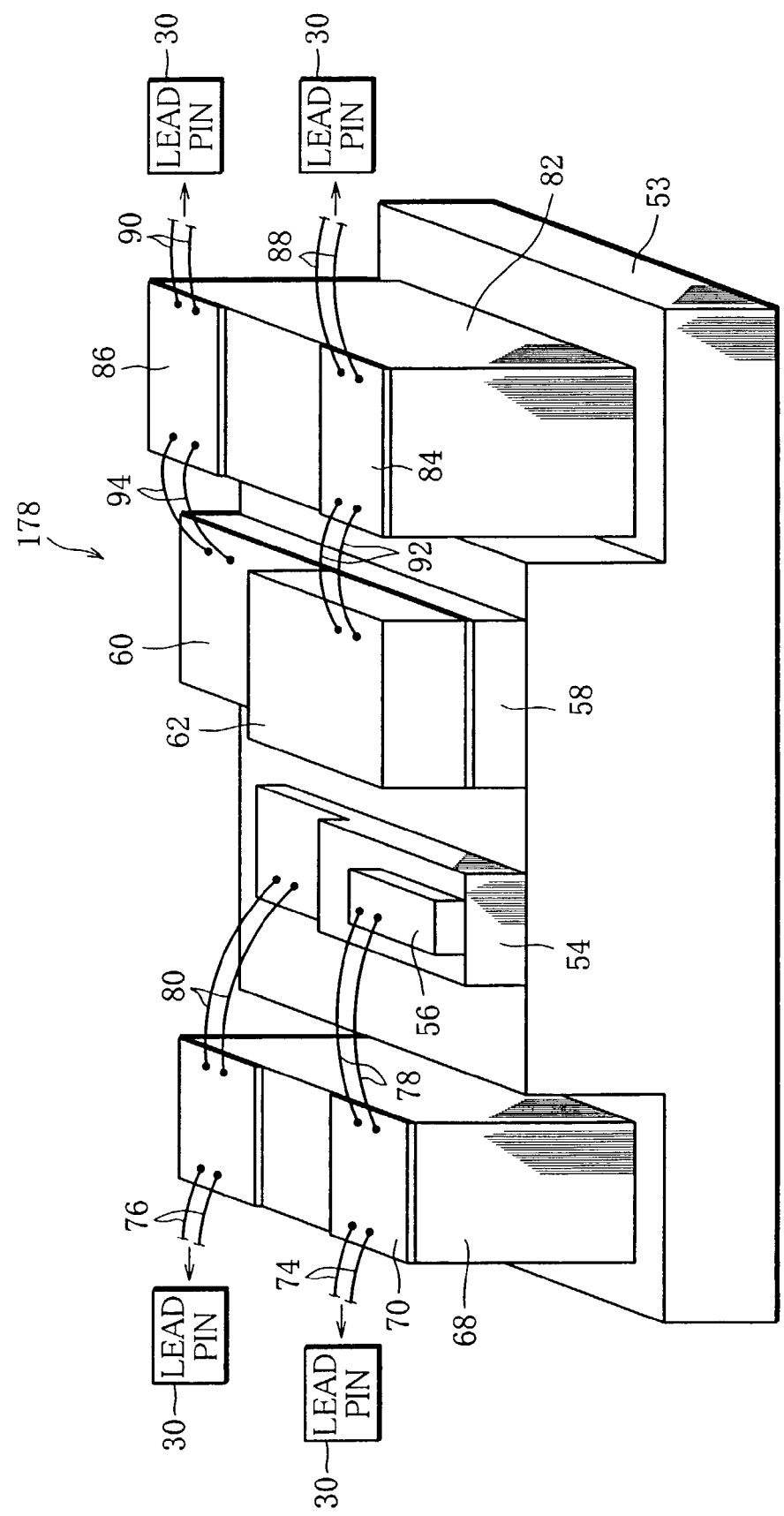
FIG. 28 is a perspective view of a light-emitting unit as used in the semiconductor laser module to which a driving method of a semiconductor laser module according to a fifth embodiment of the present invention is applied.

The method of starting up the semiconductor laser assembly of the embodiment can be applied to almost all the semiconductor laser assemblies that include the thermo-modules. A description will be given of a case of staring up the semiconductor laser assembly that includes a semiconductor laser module having, for example a light-emitting unit 178 shown in FIG. 28 in place of the light-emitting unit 38, and having about the same constitution as the SLM 22, except for not having the heater 66.

Figure 29:
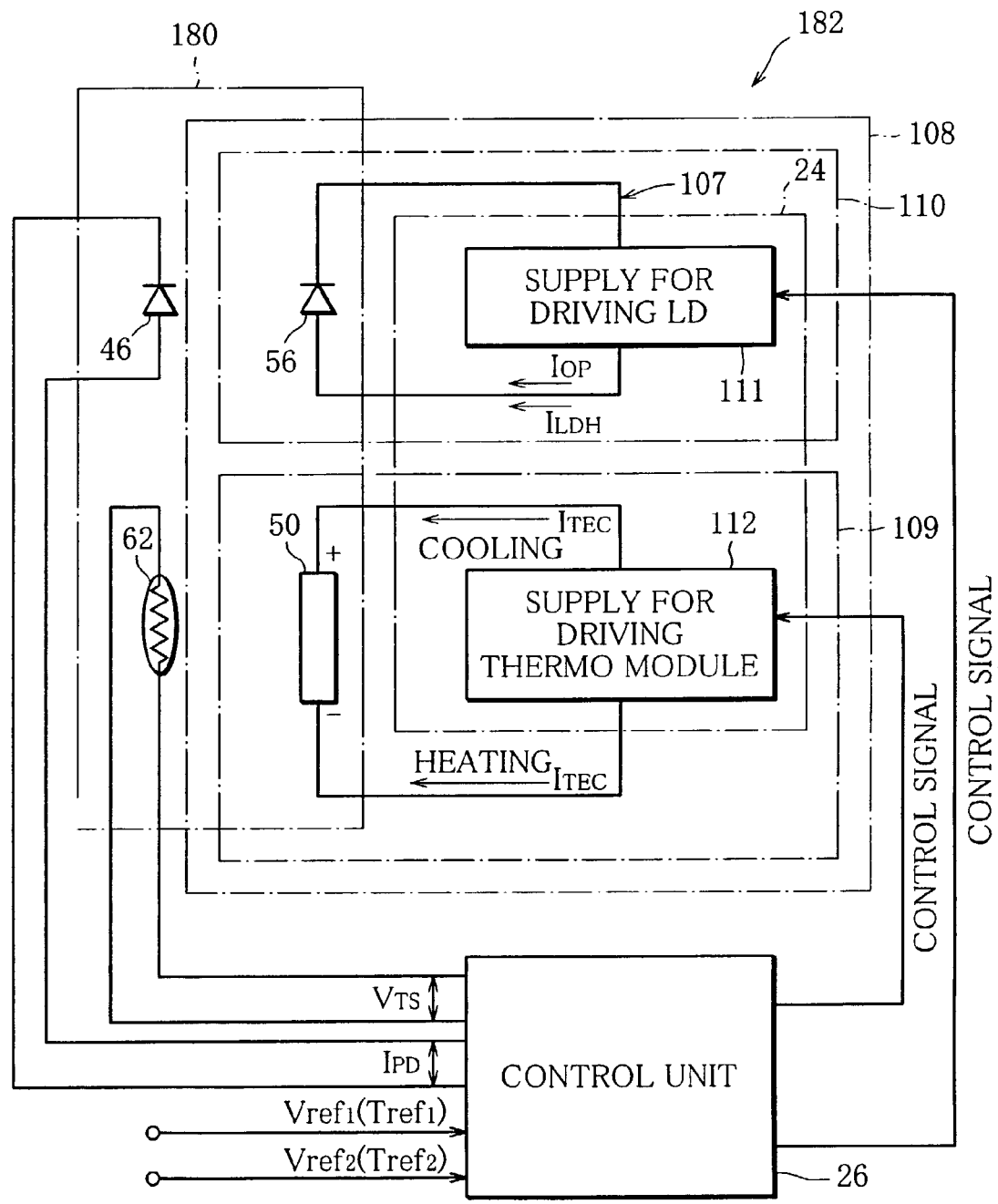
FIG. 29 is an explanatory diagram of electrical constitution of the semiconductor laser module to which a driving method of a semiconductor laser module according to a sixth embodiment of the present invention is applied.

Since a semiconductor laser module 180 used in a semiconductor laser assembly 182 does not comprise a heater 66, it is not equipped with the $S_H$ 114 as shown in the electrical constitution of FIG. 29. Then, in this SLA 182, an electric current $I_{LDH}$ is supplied to the LD 56 such that it heats up itself, and the circuit for driving LD 56 ($C_{LD}$ 107) carries out the function of a second circuit ($C_{TS2}$ 110) of the temperature controlling circuit ($C_{TS}$ 108) until the temperature Ts of the LD 56 is raised to or higher than the Tref1.

In more detail, the control unit 26 first compares the $V_{TS}$ corresponding to the Ts with the Vref1 corresponding to the Tref1 at the time of starting up the SLA 182. If the Ts is lower than the Tref1, the control unit 26 transmits a control signal to the $S_{LD}$ 111 such that the $S_{LD}$ 111 starts supplying the $I_{LDH}$ to the LD 56. The temperature of the LD 56 is thus raised by a self-heating through the $I_{LDH}$.

When the Ts becomes equal to or higher than the Tref1, or when the Ts and the Tref1 have become close enough, the control unit 26 transmits control signals to each of the $S_{TEC}$ 112 and the $S_{LD}$ 111 such that they start supplying $I_{TEC}$ to the thermo-module 50 in order to keep the Ts at Tref2, and supplying $I_{OP}$ to the LD 56 in order to keep the optical output power constant, respectively, whereby the SLA 182 is started up.

Namely, while the Ts is lower than the Tref1, the control unit 26 controls the $S_{LD}$ 111 such that the LD 56 is heated through its own current based on the $V_{TS}$ until the Ts is equal to or higher than the Tref1. After the Ts has become equal to or higher than the Tref1, the control unit 26 begins to control the $S_{LD}$ 111 so that the intensity of the laser light emitted from the LD 56 is maintained at a predetermined value based on the amount of monitor current $I_{PD}$ at the PD 46, and simultaneously begins to control the $S_{TEC}$ so that the Ts is kept constant at Tref2, which is preferably set lower than Tref1.

On the other hand, if the Ts is higher than the Tref1, the control unit 26 transmits control signals to the $S_{TEC}$ 112 and $S_{LD}$ 111 such that $S_{TEC}$ immediately starts supplying $I_{TEC}$ to the thermo-module 50 and that $S_{LD}$ starts supplying $I_{OP}$ to the LD 56 based on $I_{PD}$, whereby the SLA 182 is started up.

In this way, according to the aforementioned method, the SLA 182 can be started up without the $I_{TEC}$ to the thermo-module 50 being extraordinarily large in the heating direction. Therefore, a degradation in characteristic or a destruction of the SLA 182, such as a lowering of optical coupling efficiency between the LD 56 and the optical fiber 36 arising from the excessive $I_{TEC}$ in the heating direction, are prevented.

Sixth Embodiment

Figure 30:
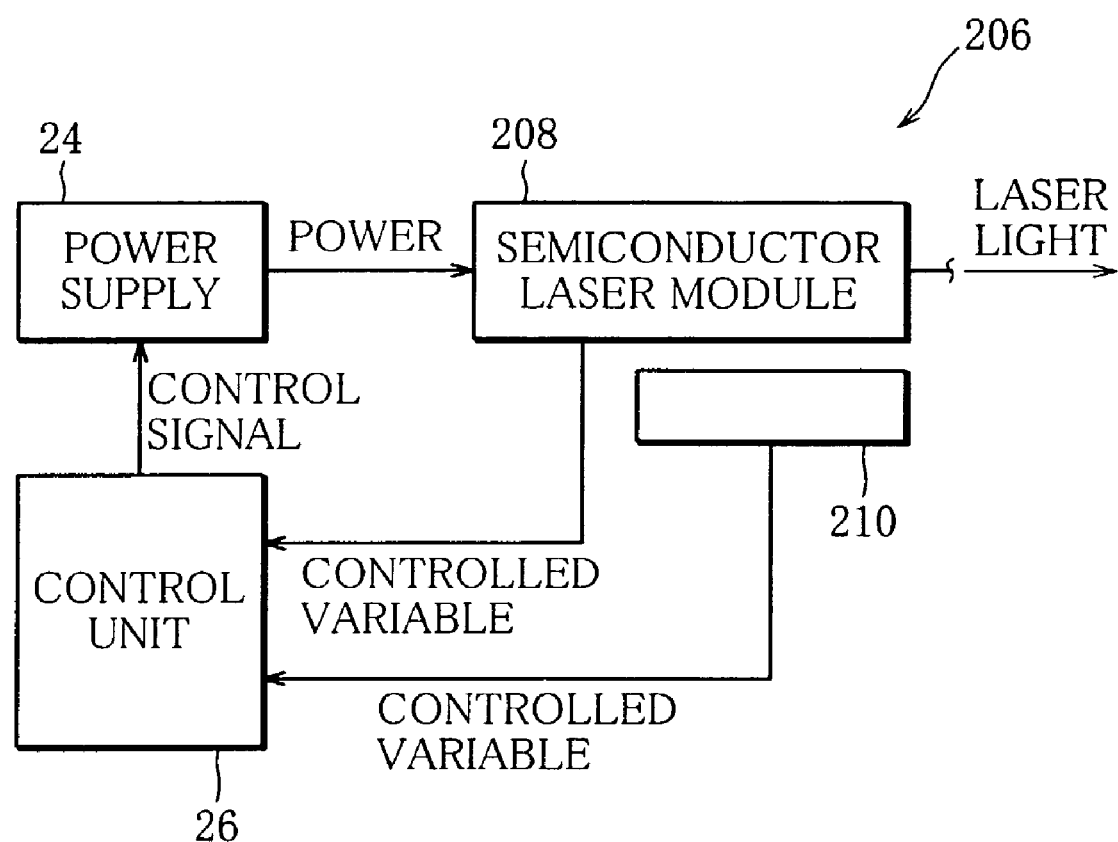
FIG. 30 is a schematic constitutional diagram of the semiconductor laser assembly according to the sixth embodiment of the present invention.

FIG. 30 shows a constitution of a semiconductor laser assembly 206 according to a sixth embodiment of the invention. The SLA 206 has about the same constitution as the SLM 22 except that it has a semiconductor laser module 208 which is not equipped with the heater 66.

A temperature sensor 210 is disposed in contact with or adjacently to the package 28 of the SLM 208 in order to measure the temperature of the environment (hereinafter referred to as a Tc) where the SLM 208 is placed. The temperature sensor 210 comprises a thermistor 212 for example, and a voltage signal across its both ends (hereinafter, referred to as a $V_{TC}$) corresponding to the Tc is input to the control unit 26.

Figure 31:
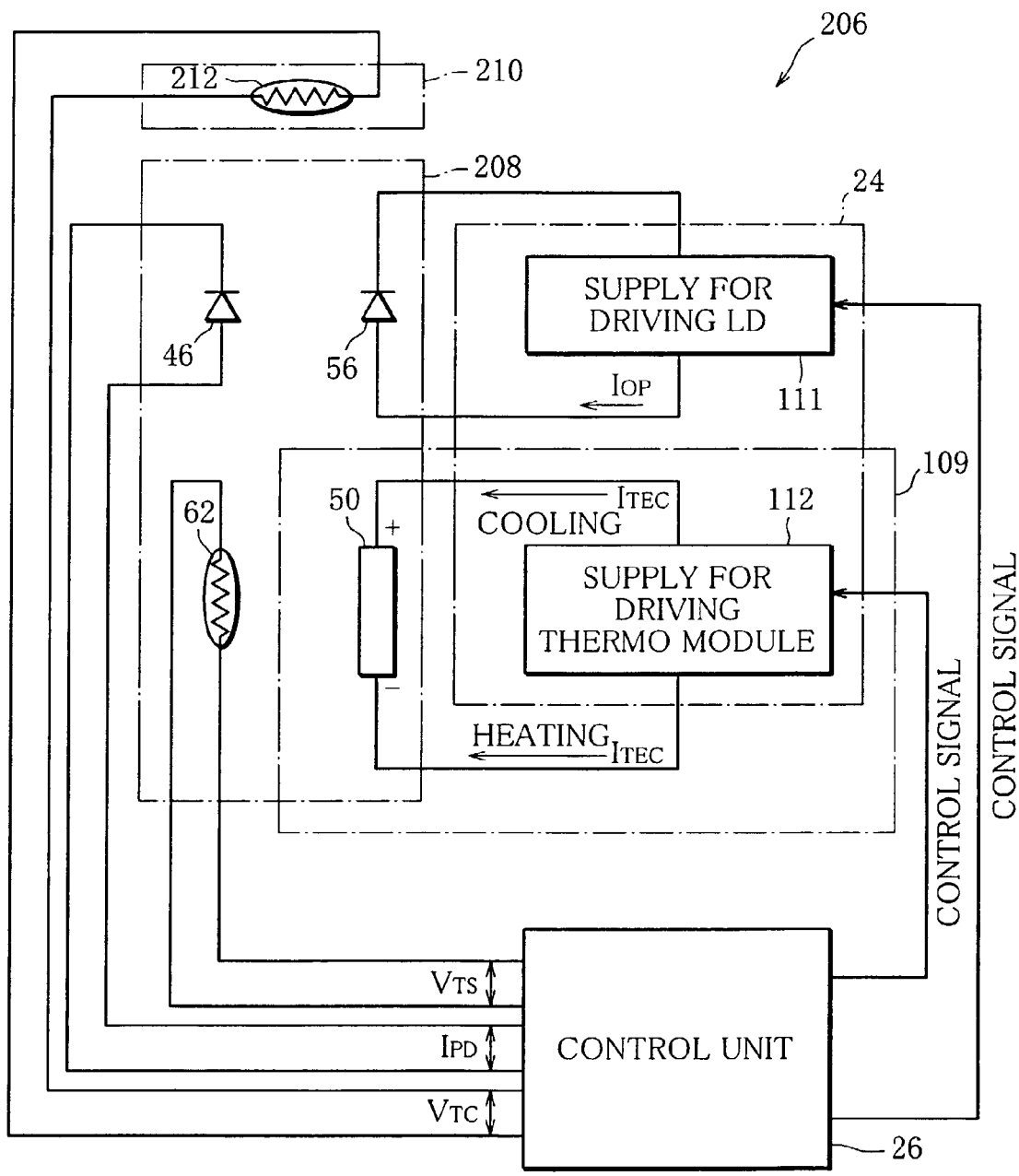
FIG. 31 is an explanatory diagram of electrical constitution of the assembly of FIG. 30.

FIG. 31 shows the electrical constitution of the SLA 206.

The method of starting up and driving the SLA 206 will be described below.

First, the control unit 26 transmits a control signal to the $S_{LD}$ 111 in order to cause the LD 56 to oscillate. The monitor current $I_{PD}$, representing the intensity of the laser light from the LD 56, is input to the control unit 26, and the control unit 26 transmits a control signal to the $S_{LD}$ 111 in order to adjust the $I_{OP}$ so that the $I_{PD}$ will be a preset value.

Prior to a supply of the $I_{TEC}$ to the thermo-module 50, the control unit 26 calculates a maximum allowable current to the thermo-module 50 in the heating direction (hereinafter, referred to as an $I_{MAX}$) based on the $I_{OP}$ and on the Tc. Herein, the maximum allowable current in the heating direction is a maximum current below which a current to the thermo-module 50 is not excessive in relation to a driving current $I_{OP}$ to the LD 56 and a temperature of the environment Tc where the LD 56 is placed,—i.e, the solder connection between the substrate 48 and the thermo-module is free from overheating and melting, and therefore the SLA 206 is free from being degraded in performance or being destructed, as described previously, under the given $I_{OP}$ and Tc—.

The control unit 26 transmits a control signal to the $S_{TEC}$ 112 to supply the $I_{TEC}$ to the thermo-module 50 in order to keep the temperature Ts of the LD 56 constant at a predetermined driving temperature, but the $I_{TEC}$ is restricted within a range that it does not exceed the $I_{MAX}$ in the heating direction, and whereby the SLA 206 is started up.

Thereafter, the SLA 206 continues to be driven with the $I_{TEC}$ being supplied from the $S_{TEC}$ 112 to the thermo-module 50, while in the heating direction the $I_{TEC}$ is restrained to or below the $I_{MAX}$. The $I_{MAX}$ may be fixed to a predetermined value in the above embodiment, it is however preferable that the $I_{MAX}$ is updated continually or at a certain intervals during the operation of the SLA 206 based on the Tc and $I_{OP}$ at the time.

The $I_{MAX}$ can be calculated based on the $I_{OP}$ and Tc by the control unit 26 in the following manner.

Figure 32:
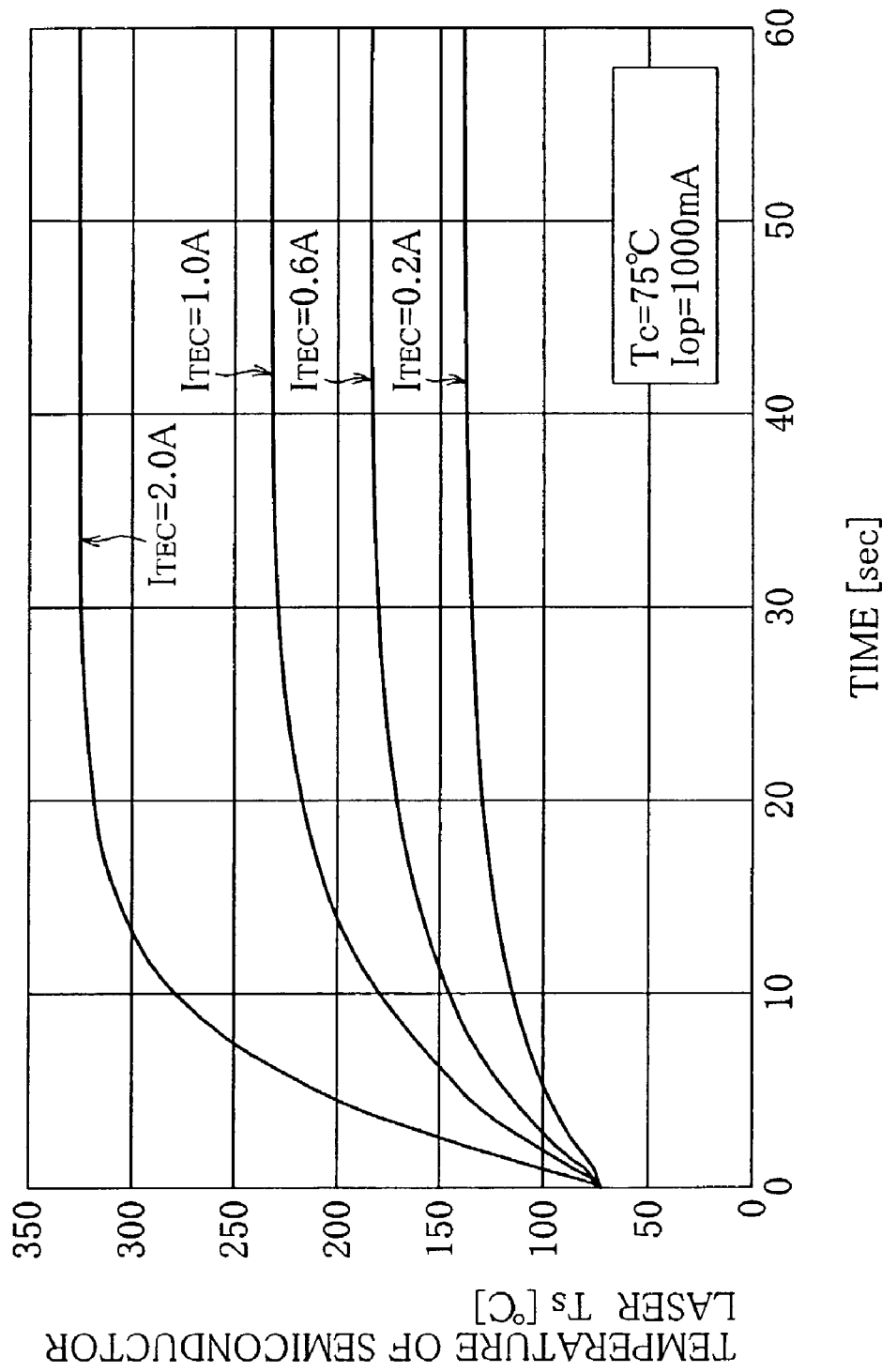
FIG. 32 is a graph showing temporal changes in a temperature $T_S$ of the semiconductor laser when an electric current $I_{TEC}$ in a heating direction is supplied to the thermo-module in the assembly of FIG. 30.

The present inventors have conducted an experiment where a temporal change in Ts was monitored for the cases of four different levels of $I_{TEC}$ of 0.2, 0.6, 1.0 and 2.0 A being supplied constantly to a thermo-module in the heating direction, wherein the $I_{OP}$ and the Tc were kept at 1000 mA and 75° C., respectively. FIG. 32 shows the results of the experiment.

As shown in the figure, the Ts measured by the thermistor 62 disposed in the vicinity of the LD 56 saturated to different values depending on the magnitude of the $I_{TEC}$, in about 20 seconds after the current began to be supplied. For example, when the $I_{TEC}$ is 0.2 A in the heating direction, the Ts saturated at 140° C., which is close to the melting point of In—Pb—Ag eutectic solder (148° C.) used to connect the substrate 48 to the thermo-module 50. So, when the $I_{TEC}$ exceeds 0.2 A in the heating direction for $I_{OP}$ and Tc of 1000 mA and 75° C., respectively, the solder may be melted and SLA 206 may be destroyed.

And if a maximum allowable temperature that may be allowed for the LD 56 (hereinafter, referred to as a $T_{MAX}$) is set at the melting point of solder fixing together the substrate 48 and the upper insulating plate 52 of the thermo-module 50, the magnitude of the $I_{TEC}$ in the heating direction that may raise the Ts to the $T_{MAX}$ is uniquely determined for given $I_{OP}$ and Tc. Herein, the maximum allowable current in the heating direction $I_{MAX}$ is defined as the magnitude of the $I_{TEC}$ in the heating direction with which the $T_{MAX}$ is reached by the LD 56 and the solder is melted under given $I_{OP}$ and Tc.

Figure 33:
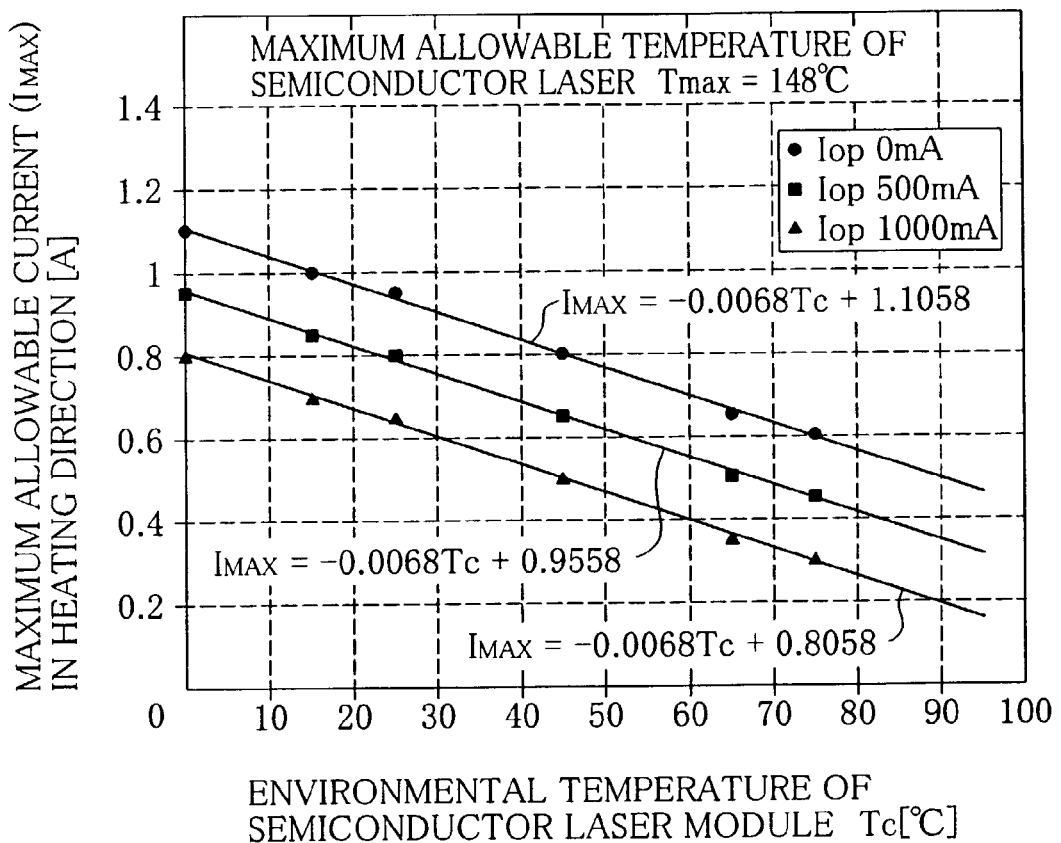
FIG. 33 is a graph showing the relation among a temperature Tc of an environment in which the semiconductor laser module is placed, the electric current $I_{OP}$ supplied to the semiconductor laser, and the maximum allowable electric current $I_{MAX}$ in the heating direction that may be supplied to the thermo-module, in the assembly of FIG. 30.

The present inventors have then conducted a more detailed experiment to obtain qualitative and quantitative relation among the $I_{OP}$, Tc, $T_{MAX}$, and $I_{MAX}$. In more detail, the value of the maximum allowable current $I_{MAX}$ was experimentally determined for various combination of $I_{OP}$ and Tc, which were varied over three levels of 0, 500, 1000 mA and over five levels of 0, 15, 25, 45, 65, 75° C., respectively, with $T_{MAX}$ being set at 148° C. FIG. 33 shows the results of the experiment, from which it was found that the $I_{MAX}$ and Tc are linearly related to each other if the $I_{OP}$ is constant, and that the $I_{MAX}$ and $I_{OP}$ are linearly related to each other if the Tc is constant.

Therefore, the $I_{MAX}$ can be expressed as a function of the Tc and $I_{OP}$ as follow:

$$I_{MAX}=f(Tc, I_{OP})=aTc+bI_{OP}+c \qquad (1)$$

where a, b and c are constants.

Using the experimental data obtained by the present inventors, when the $I_{OP}$ is 0 mA, the Equation (1) becomes $$I_{MAX}=-0.0068Tc+1.1058 \qquad (2)$$

When the $I_{OP}$ is 500 mA, it becomes $$I_{MAX}=-0.0068Tc+0.9558 \qquad (3)$$

And when $I_{OP}$ is 1000 mA, it becomes $$I_{MAX}=-0.0068Tc+0.8058 \qquad (4)$$

The equations (2) to (4) are used to find constants a, b, and c as follows:

$$I_{MAX}=-0.0068Tc-0.0003I_{OP}+1.1058 \qquad (5)$$

The equation (5) can be used to calculate the maximum allowable current $I_{MAX}$ to the thermo-module 50 in the heating direction as a function of the Tc and $I_{OP}$.

The constants a, b and c in Equation (1) above will be different among individual SLM's 208, or among SLM's of different specifications or constitution. Further, they will also be different depending on conditions of detecting the Tc, such as a position or the like of a temperature sensor 210, or depending on conditions, for example, as to what temperature the maximum temperature $T_{MAX}$ is set at. Therefore, the constants a, b and c need to be optimized in accordance with the SLM used and the configuration of the components. The optimization can be carried out by the aforementioned experiments, simulation or the like.

In this way, in the SLM 206, since the $I_{TEC}$ is supplied to the thermo-module 50 such that it is restrained to or less than the $I_{MAX}$ if it is in the heating direction, the temperature Ts can be prevented from exceeding the $T_{MAX}$ and consequently a degradation in characteristic or a destruction of the SLA 206, such as a lowering of optical coupling efficiency between the LD 56 and the optical fiber 36, arising from the excessive $I_{TEC}$ in the heating direction, are prevented.

In this sixth embodiment, an example is described in which the $T_{MAX}$ is set at a melting point of 148° C. of the In—Pb—Ag eutectic solder. However, the $T_{MAX}$ does not need to be limited to this particular temperature. For example, a lower temperature leaving a margin to the melting point of the In—Pb—Ag eutectic solder may be selected as the $T_{MAX}$. The $T_{MAX}$ may be selected depending on the melting point of a thermal fusion type connection material used in the SLM 208, therefore when solder other than In—Pb—Ag is used, the $T_{MAX}$ is selected accordingly. Further, if it is necessary to restrain the Ts below a certain temperature because of other factors, the $T_{MAX}$ may be selected accordingly. It is noted that the $I_{MAX}$ as well as constants a, b and c will be changed according to the selected $T_{MAX}$.

What is claimed is:

1. An optical module comprising:
a package;
an optical device housed in the package, and having a temperature-dependent characteristic;
a thermo-module connected to the optical device to control a temperature of the optical device and configured to heat or cool the optical device when supplied with a first electric current in one direction or a second electric current in a direction opposite to the first electric current, respectively; and
a heating element that is only used to generate heat and is disposed close to the optical device and configured to heat the optical device when supplied with an electric current.

2. The optical module according to claim 1, wherein the optical device is connected to the thermo-module by use of a thermal fusion connection material.

3. The optical module according to claim 1, wherein the optical device is one of a semiconductor laser, a photodiode and an arrayed waveguide grating device.

4. The optical module according to claim 1, wherein the optical device is a semiconductor laser, said module further comprising:
a carrier on which the semiconductor laser is disposed together with the heating element and a temperature sensor for detecting the temperature of the semiconductor laser.

5. The optical module according to claim 4, further comprising:
a mount disposed on the carrier, the temperature sensor and the heating element being disposed on the carrier via the mount.

6. The optical module according to claim 1, wherein the heating element is one of a resistive heating element and a heat generating diode.

7. An optical module comprising:
a package;
an optical device housed in the package, and having a temperature-dependent characteristic;
a thermo-module connected to the optical device to control a temperature of the optical device and configured to heat or cool the optical device when supplied with a first electric current in one direction or a second electric current in a direction opposite to the first electric current, respectively; and
a heating element disposed close to the optical device and configured to heat the optical device when supplied with an electric current,
wherein the heating element is a heat generating diode provided in electrically parallel to the thermo-module and oriented so as to be reversely biased to the second electric current.

8. An optical module comprising:
a package;
an optical device housed in the package, and having a temperature-dependent characteristic;
a thermo-module connected to the optical device to control a temperature of the optical device and configured to heat or cool the optical device when supplied with a first electric current in one direction or a second electric current in a direction opposite to the first electric current, respectively;
a heating element disposed close to the optical device and configured to heat the optical device when supplied with an electric current; and
a series circuit including the heating element and a diode serially connected to the heating element, the series circuit being provided in electrically parallel to the thermo-module so that the diode is reversely biased to the second electric current.

9. An optical apparatus comprising:
an optical module including
a package,
an optical device housed in the package and having a temperature-dependent characteristic,
a temperature sensor disposed in the vicinity of the optical device and configured to detect a temperature of the optical device, and
a thermo-module connected to the optical device to control the temperature of the optical device and configured to heat or cool the optical device when supplied with a first electric current in one direction or a second electric current in a direction opposite to the first electric current, respectively;
a thermo-module power supply for supplying an electric current to the thermo-module; and
a control unit for controlling a polarity and an intensity of the electric current from the thermo-module power supply to the thermo-module thereby heating or cooling the optical device based on the temperature of the optical device, the control unit having an overheat prevention function for preventing the optical device from being overheated due to a heating operation of the thermo-module.

10. The optical apparatus according to claim 9, further comprising:
a heating element disposed close to the optical device and configured to heat the optical device when supplied with an electric current; and
a heating element power supply for supplying the electric current to the heating element, the heating element power supply being controlled by the control unit.

11. The optical apparatus according to claim 10, wherein the control unit starts up the optical apparatus in such a manner that the heating element power supply starts supplying the electric current to the heating element before the thermo-module power supply starts supplying the electric current to the thermo-module.

12. The optical apparatus according to claim 11, wherein the control unit starts up the optical apparatus in such a manner that the thermo-module power supply starts supplying the electric current to the thermo-module if the temperature detected by the temperature sensor is equal to or greater than a predetermined temperature.

13. The optical apparatus according to claim 10, wherein the control unit starts up the optical apparatus in such a manner that the heating element power supply starts supplying the electric current to the heating element before the thermo-module power supply starts supplying the electric current to the thermo-module if the temperature detected by the temperature sensor is equal to or lower than a predetermined temperature.

14. The optical apparatus according to claim 10, wherein the control unit drives the optical apparatus in such a manner that the heating element power supply supplies the electric current to the heating element simultaneously with the thermo-module power supply supplying the first electric current to the thermo-module.

15. The optical apparatus according to claim 10, further including
a bypass circuit connected in electrically parallel to the thermo-module, said bypass circuit shunting at least a part of the first electric current therethrough and preventing an entire of the second electric current from flowing therethrough thereby directing the entire of the second electric current to the thermo-module.

16. The optical apparatus according to claim 15,
wherein the bypass circuit includes a diode oriented so as to be reversely biased to the second electric current.

17. The optical apparatus according to claim 16, further comprising:
another diode connected electrically serially to the thermo-module and oriented so as to be reversely biased to the first electric current.

18. The optical apparatus according to claim 10, wherein the thermo-module and the heating element are electrically connected in parallel to each other, and wherein the thermo-module power supply also serves as the heating element power supply, supplying the first electric current to the thermo-module and to the heating element.

19. The optical apparatus according to claim 18, wherein the heating element is a heat generating diode oriented so as to be reversely biased to the second electric current.

20. The optical apparatus according to claim 10, wherein the thermo-module and the heating element are electrically connected in parallel to each other, wherein the thermo-module power supply also serves as the heating element power supply, and wherein
the optical module further comprises
a diode connected electrically serially to the heating element and oriented so as to be reversely biased to the second electric current.

21. The optical apparatus according to claim 20, further comprising another diode connected electrically serially to the thermo-module and oriented so as to be reversely biased to the first electric current.

22. The optical apparatus according to claim 9, wherein the optical device is connected to the thermo-module by use of a thermal fusion connection material.

23. The optical apparatus according to claim 9, wherein the optical device is one of a semiconductor laser, a photodiode and an arrayed waveguide grating device.

24. The optical apparatus according to claim 9, wherein the optical device is a semiconductor laser, the semiconductor laser being connected to the thermo-module by use of a thermal fusion connection material, wherein
the optical apparatus further comprises a laser power supply for supplying a driving electric current to the semiconductor laser, wherein
the control unit has an environmental temperature sensor disposed outside the package and configured to detect an environmental temperature around the optical module, and wherein
the overheat prevention function of the control unit includes
a calculation function for finding a maximum allowable first electric current to the thermo-module based on the environmental temperature and the driving electric current to the semiconductor laser, the maximum allowable first electric current being an electric current with which the temperature of the semiconductor laser is kept at a predetermined maximum temperature or less even if continues to be supplied to the thermo-module, and
a restriction function for restricting the first electric current to the thermo-module to the maximum allowable first electric current or less.

25. The optical apparatus according to claim 24, wherein the predetermined maximum temperature is equal to or lower than a melting point of the thermal fusion connection material.

26. The optical apparatus according to claim 25, wherein the calculation function finds the maximum allowable first electric current, being designated as $I_{MAX}$, using an equation as follows:

$$I_{MAX}=aTc+bIop+c$$

(where Tc is the environmental temperature surrounding the optical module, Iop is the driving electric current to the semiconductor laser, and a, b and c are constants.

27. The optical apparatus according to claim 9, wherein the optical device is a semiconductor laser, wherein
the optical apparatus further comprises a laser power supply for supplying an electric current to the semiconductor laser, the laser power supply being controlled by the control unit, and wherein
the overheat prevention function of the control unit is carried out in such a manner that the laser power supply is started to supply an electric current to the semiconductor laser thereby to heat up the semiconductor laser before the thermo-module power supply is started to supply the first electric current or the second electric current to the thermo-module in starting up the optical apparatus.

28. The optical apparatus according to claim 9, wherein the optical device is a semiconductor laser, wherein
the optical apparatus further comprises a laser power supply for supplying an electric current to the semiconductor laser, the laser power supply being controlled by the control unit, and wherein
the overheat prevention function of the control unit is carried out in such a manner that the laser power supply is started to supply an electric current thereby to heat up the semiconductor laser before the thermo-module power supply is started to supply the first electric current or the second electric current to the thermo-module, if the temperature detected by the temperature sensor is equal to or lower than a predetermined temperature in starting up the optical apparatus.

29. The optical apparatus according to claim 27, wherein the overheat prevention function of the control unit is carried out in such a manner that the thermo-module power supply is started to supply the electric current to the thermo-module if the temperature detected by the temperature sensor is equal to or greater than a predetermined temperature in starting up the optical apparatus.

30. A method for using an optical module,
the optical module including:
a package;
an optical device housed in the package and having a temperature-dependent characteristic;
a temperature sensor disposed in the vicinity of the optical device and configured to detect a temperature of the optical device; and
a thermo-module connected to the optical device to control the temperature of the optical device and configured to heat or cool the optical device when supplied with a first electric current in one direction or a second electric current in a direction opposite to the first electric current, respectively; wherein
the method comprises a preheating step for preliminarily heating the optical device prior to supplying one of the first electric current and the second electric current to the thermo-module, when starting up the optical module.

31. The method according to claim 30, wherein the optical device is connected to the thermo-module by use of a thermal fusion connection material.

32. The method according to claim 30, wherein the optical device is one of a semiconductor laser, a photodiode and an arrayed waveguide grating device.

33. The method according to claim 30, wherein the optical module further includes a heating element disposed close to the optical device and configured to generate heat when supplied with an electric current, and wherein
the preheating step is carried out by preliminarily heating the optical device with the heating element.

34. The method according to claim 30 further comprising a temperature detection step for detecting a temperature of the optical device with the temperature sensor, wherein
the preheating step is carried out if the temperature detected in the temperature detection step is equal to or lower than a predetermined temperature.

35. The method according to claim 30, wherein
one of the first electric current and the second electric current is started to be supplied to the thermo-module if the temperature detected in the temperature detection step is equal to or greater than a predetermined temperature.

36. The method according to claim 30, wherein
the optical device is a semiconductor laser, and
the preheating step is carried out by supplying an electric current to the semiconductor laser so that the semiconductor laser is heated by the electric current.

37. The method according to claim 36 further comprising a temperature detection step for detecting a temperature of the semiconductor laser with the temperature sensor, wherein
the preheating step is carried out if the temperature is lower than a predetermined temperature.

38. The method according to claim 36 further comprising a temperature detection step for detecting a temperature of the semiconductor laser with the temperature sensor, wherein
one of the first electric current and the second electric current is started to be supplied to the thermo-module if the temperature detected in the temperature detection step is equal to or greater than a predetermined temperature.

39. A method for using an optical module,
the optical module including:
a package;
an optical device housed in the package and having a temperature-dependent characteristic;
a temperature sensor disposed in the vicinity of the optical device and configured to detect a temperature of the optical device;
a heating element disposed close to the optical device and configured to generate heat when supplied with an electric current;
a thermo-module connected to the optical device to control the temperature of the optical device and configured to heat or cool the optical device when supplied with a first electric current in one direction or a second electric current in a direction opposite to the first electric current, respectively; wherein
the method comprises:
a temperature detection step for detecting a temperature of the optical device during an operation thereof, and
a temperature control step for supplying the first electric current or second electric current to the thermo-module based on the deviation of the temperature detected in the temperature detection step of the optical device from a predetermined value in order to keep the temperature of the optical device at the predetermined value,
the temperature control step including a process of supplying an electric current to the heating element when the first electric current is supplied to the thermo-module.

40. The method according to claim 39, wherein
the optical device is connected to the thermo-module by use of a thermal fusion connection material.

41. The method according to claim 39, wherein
the optical device is one of a semiconductor laser, a photodiode and an arrayed waveguide grating device.

42. A method for using an optical module,
the optical module including:
a package;
a semiconductor laser housed in the package and having a temperature-dependent characteristic;
a temperature sensor disposed in the vicinity of the semiconductor laser and configured to detect a temperature of the semiconductor laser;
a thermo-module connected to the semiconductor laser to control the temperature of the semiconductor laser and configured to heat or cool the semiconductor laser when supplied with a first electric current in one direction or a second electric current in a direction opposite to the first electric current, respectively; wherein
the method comprises:
an environmental temperature detection step for detecting a temperature of an environment in which the optical module is placed, and
a temperature control step for supplying one of the first electric current and second electric current to the thermo-module in order to keep the temperature of the semiconductor laser at a predetermined value,
the temperature control step including:
a calculation process for finding a maximum allowable first electric current to the thermo-module based on the temperature of the environment and the driving electric current to the semiconductor laser, the maximum allowable first electric current being an electric current with which the temperature of the semiconductor laser is kept at a predetermined maximum temperature or less even if continues to be supplied to the thermo-module, and
a restriction process for restricting the first electric current to the thermo-module to the maximum allowable first electric current or less.

43. The method according to claim 42, wherein
the semiconductor laser device is connected to the thermo-module by use of a thermal fusion connection material, and
the predetermined maximum temperature is a melting point of the thermal fusion connection material or less.

44. The method according to claim 42, wherein
the calculation process includes calculating the maximum allowable first electric current $I_{MAX}$ using an equation:

$$I_{MAX} = aTc + bIop + c$$

(where Tc is the temperature of the environment in which the optical module is placed, Iop is the electric current to the semiconductor laser, and a, b and c are constants.

* * * * *